US012812896B2

(12) United States Patent
Kang et al.

(10) Patent No.: US 12,812,896 B2
(45) Date of Patent: Nov. 24, 2026

(54) VERTICAL FIELD-EFFECT TRANSISTOR WITH BACKSIDE GATE CONTACT

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 18/632,538

(22) Filed: Apr. 11, 2024

(65) Prior Publication Data

US 2025/0324654 A1 Oct. 16, 2025

(51) Int. Cl.

*H10D 30/63* (2025.01)
*H10D 30/01* (2025.01)

(Continued)

(52) U.S. Cl.

CPC ........... *H10D 30/63* (2025.01); *H10D 30/025* (2025.01); *H10D 64/514* (2025.01); *H10D 84/40* (2025.01); *H10W 20/42* (2026.01); *H10W 20/435* (2026.01)

(58) Field of Classification Search

CPC ...... H10D 30/63; H10D 30/025; H10D 84/40; H10D 64/514; H10W 20/42; H10W 20/435

(Continued)

(56) References Cited

U.S. PATENT DOCUMENTS 10,020,381 B1 7/2018 Fan et al.
10,068,987 B1 9/2018 Zang (Continued)

FOREIGN PATENT DOCUMENTS

EP 2901485 B1 12/2021
GB 2644672 A 5/2026

(Continued)

OTHER PUBLICATIONS

International Searching Authority, "Notification of Transmittal of the International Search Report and the Written Opinion of the International Searching Authority, or Declaration," Patent Cooperation Treaty, Jul. 28, 2025, 6 pages, International Application No. PCT/IB2025/052756.

(Continued)

*Primary Examiner* — Tu-Tu V Ho
(74) *Attorney, Agent, or Firm* — Kimberly Zillig; Ryan, Mason & Lewis, LLP

(57) ABSTRACT

A semiconductor structure includes a gate structure disposed between a first vertical field-effect transistor and a second vertical field-effect transistor, a first liner layer disposed on the gate structure and a sidewall of the first vertical field-effect transistor and the second vertical field-effect transistor, a second liner layer disposed on the gate structure and a sidewall of the second vertical field-effect transistor, a backside gate contact between opposing sidewalls of the first liner layer and the second liner layer and having a first surface disposed on the gate structure, and a backside metal via disposed on a second surface of the backside gate contact. The first surface of the backside gate contact has a first width and the second surface of the backside gate contact has a second width greater than the first width.

20 Claims, 19 Drawing Sheets

(51) Int. Cl.
*H10D 64/27* (2025.01)
*H10D 84/40* (2025.01)
*H10W 20/41* (2026.01)
*H10W 20/42* (2026.01)

(58) Field of Classification Search
USPC .......................................................... 257/288
See application file for complete search history.

(56) References Cited

U.S. PATENT DOCUMENTS

| | | | |
|---|---|---|---|
| 10,699,942 B2 | 6/2020 | Xie et al. | |
| 11,282,957 B2 | 3/2022 | Do | |
| 11,688,737 B2 | 6/2023 | Do et al. | |
| 11,810,949 B2 | 11/2023 | Peng et al. | |
| 2017/0309527 A1 | 10/2017 | Cheng et al. | |
| 2022/0302255 A1 | 9/2022 | Peng et al. | |
| 2022/0310811 A1* | 9/2022 | Min | H10D 30/6219 |
| 2023/0064127 A1 | 3/2023 | Lee et al. | |
| 2023/0223276 A1 | 7/2023 | Tsao et al. | |
| 2024/0006315 A1 | 1/2024 | Xie et al. | |
| 2024/0072051 A1 | 2/2024 | Anderson et al. | |

FOREIGN PATENT DOCUMENTS

| | | |
|---|---|---|
| WO | 2024/069277 A1 | 4/2024 |
| WO | 2025/215437 A1 | 10/2025 |

OTHER PUBLICATIONS

Intellectual Property Office, Patents Act 1977: Search Report under Section 18(3), Apr. 2, 2026, 4 Pages, GB Application No. 2603905.7.

Intellectual Property Office, Patents Act 1977: Response to Examination Report, Jul. 28, 2026, 02 Pages, GB Application No. 2603905.7.

Intellectual Property Office, Patents Act 1977: Search Report under Section 18(3), Sep. 15, 2026, 4 Pages, GB Application No. 2603905.7.

* cited by examiner

VERTICAL FIELD-EFFECT TRANSISTOR WITH BACKSIDE GATE CONTACT

BACKGROUND

Fin field-effect transistor (FiN-FET) devices include a transistor architecture that uses raised source-to-drain channel regions, referred to as fins. Known FiN-FET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle-of-the-line (MOL) resistance.

Vertical field-effect transistors (VFETs) (also referred to as vertical transport field-effect transistors (VTFETs)) have become viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region.

SUMMARY

Illustrative embodiments of the present application include techniques for use in semiconductor manufacture. In an illustrative embodiment, a semiconductor structure includes a gate structure disposed between a first vertical field-effect transistor and a second vertical field-effect transistor, a first liner layer disposed on the gate structure and a sidewall of the first vertical field-effect transistor and the second vertical field-effect transistor, a second liner layer disposed on the gate structure and a sidewall of the second vertical field-effect transistor, a backside gate contact between opposing sidewalls of the first liner layer and the second liner layer and having a first surface disposed on the gate structure, and a backside metal via disposed on a second surface of the backside gate contact. The first surface of the backside gate contact has a first width and the second surface of the backside gate contact has a second width greater than the first width.

In another illustrative embodiment, a semiconductor includes a first vertical field-effect transistor including a first frontside source/drain region and a first backside source/drain contact disposed on the first frontside source/drain region, a second vertical field-effect transistor adjacent the first vertical field-effect transistor and including a second frontside source/drain region and a second backside source/drain contact disposed on the second frontside source/drain region, a gate structure disposed between the first vertical field-effect transistor and the second vertical field-effect transistor, a liner layer disposed on the gate structure and opposing sidewalls of the first vertical field-effect transistor and the second vertical field-effect transistor, a backside gate contact having a first surface disposed on the gate structure and between the liner layer on the opposing sidewalls, and a backside metal via disposed on a second surface of the backside gate contact. The first surface of the backside gate contact has a first width and the second surface of the backside gate contact has a second width greater than the first width.

In yet another illustrative embodiment, an integrated circuit includes one or more semiconductor structures. At least one of the one or more semiconductor structures is a semiconductor structure according to one or more of the foregoing illustrative embodiments.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1A:
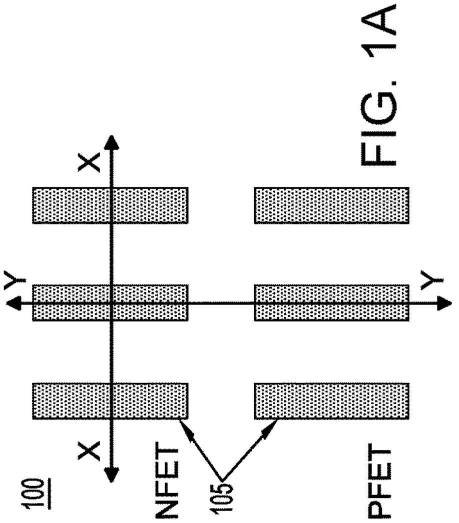
FIG. 1A is a top-down view illustrating a semiconductor structure during an intermediate step of a method of fabricating a vertical field-effect transistor structure, according to an illustrative embodiment.

Various illustrative embodiments of the invention may be described herein in the context of illustrative methods for forming a vertical field-effect transistor structure having at least a backside gate contact, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Detailed embodiments of the semiconductor structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof are to be broadly construed to relate to the disclosed structures and methods, as oriented in the drawings, wherein such structures may be understood to have the same configuration (e.g., layers stacked in the same order) even if the structure is rotated to a different angle from that shown in the drawings.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

It is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the interest of not obscuring the presentation of the embodiments of the present disclosure, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present disclosure, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include, but are not limited to, physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The patterns created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL. The conductive contacts of the MOL layer provide electrical connections between the integrated circuitry of the FEOL layer and a first level of metallization of a BEOL structure that is formed over the FEOL/MOL layers.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

As mentioned above, VFETs have become viable device options for scaling semiconductor devices (e.g., complementary metal oxide semiconductor (CMOS) devices) to 5 nanometer (nm) node and beyond. However, by scaling down the semiconductor devices the frontside has become too crowded in the fabrication process. Illustrative embodiments provide methods and structures for overcoming the foregoing drawback by providing a backside gate contact extending a frontside gate structure into a backside interlevel dielectric layer and connecting a backside metal via to the frontside gate structure, thereby alleviating the problem of an overcrowded frontside of the semiconductor device.

Referring now to the drawings in which like numerals represent the same of similar elements, FIGS. 1A-19B illustrate various processes for fabricating VFETs having a self-aligned backside gate contact to enable backside wring for the VTFET. Note that the same reference numeral (100) is used to denote the semiconductor structure through the various intermediate fabrication stages illustrated in FIGS. 1A through 19B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-19B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 1C:
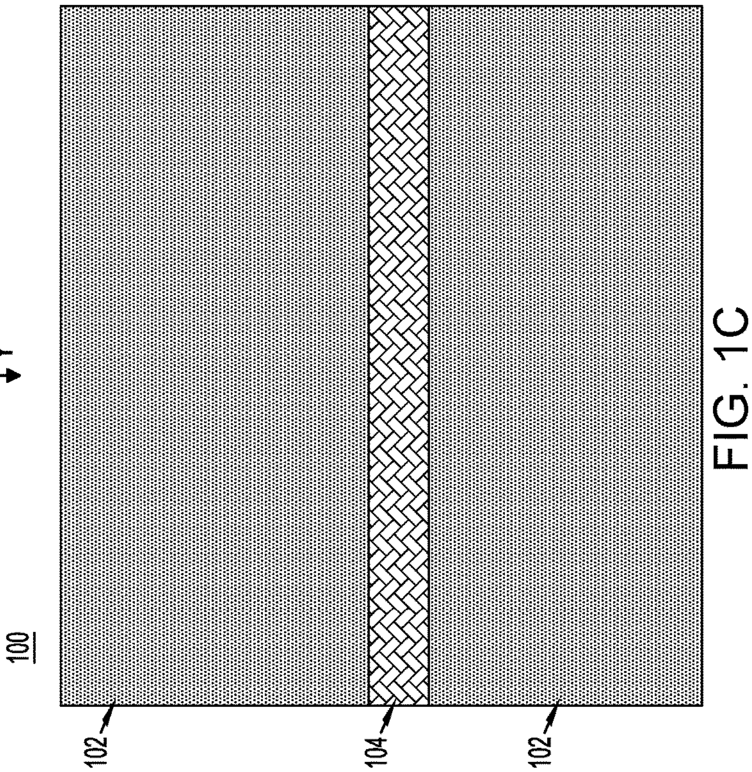
FIG. 1C is a cross-sectional view of a semiconductor structure taken along the Y-Y axis of FIG. 1A during the intermediate step, according to an illustrative embodiment.
Figure 1B:
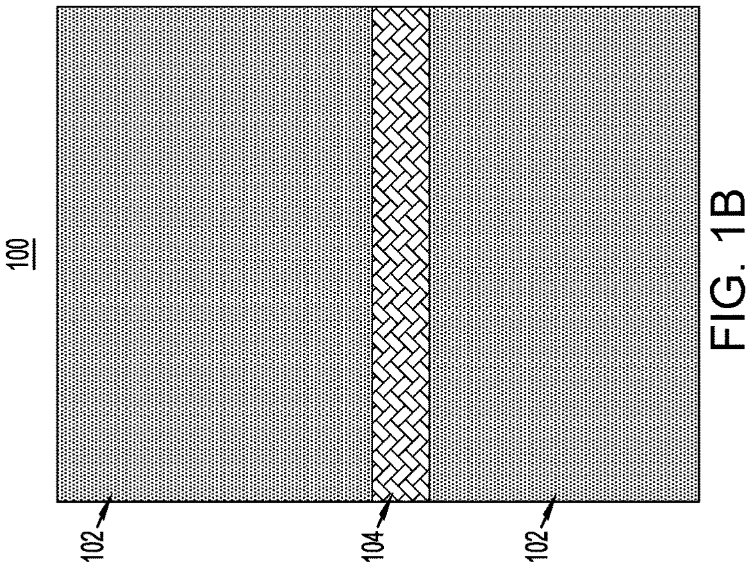
FIG. 1B is a cross-sectional view of the semiconductor structure taken along the X-X axis of FIG. 1A during the intermediate step, according to an illustrative embodiment.

FIG. 1A shows a top-down view of a semiconductor structure 100, FIG. 1B shows a cross-sectional view of the semiconductor structure 100 and FIG. 1C shows a cross-sectional view of the semiconductor structure 100. The top-down view of FIG. 1A shows the semiconductor structure 100 with vertical fins 105 of a NFET device and a PFET device. The cross-sectional view of FIG. 1B is taken along the line X-X in the top-down view, and the cross-sectional view of FIG. 1C is taken along the line Y-Y in the top-down view.

Semiconductor structure 100 includes a substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, the substrate 102 is silicon.

An etch stop layer 104 is formed in the substrate 102. The etch stop layer 104 may include a buried oxide (BOX) layer or silicon germanium (SiGe), or another suitable material such as a III-V semiconductor epitaxial layer.

Figure 2B:
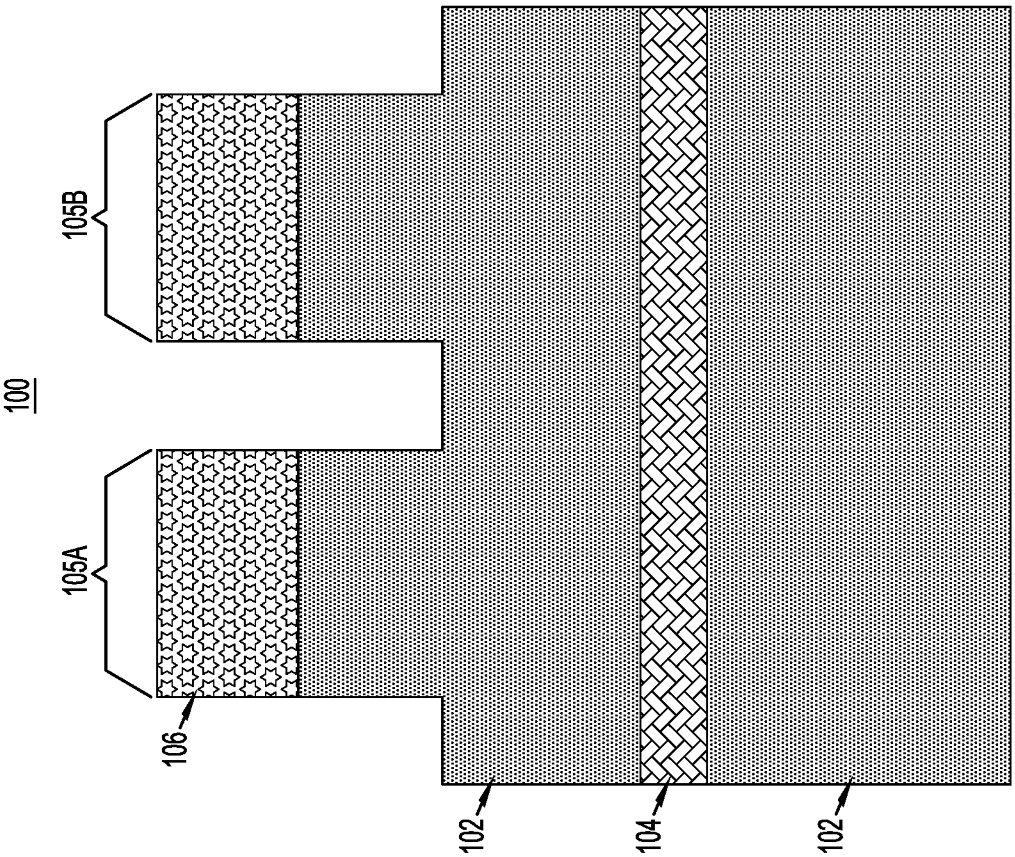
FIG. 2B is a cross-sectional view of the semiconductor structure taken along the Y-Y axis of FIG. 1A for use at the second-intermediate fabrication stage, according to an illustrative embodiment.
Figure 2A:
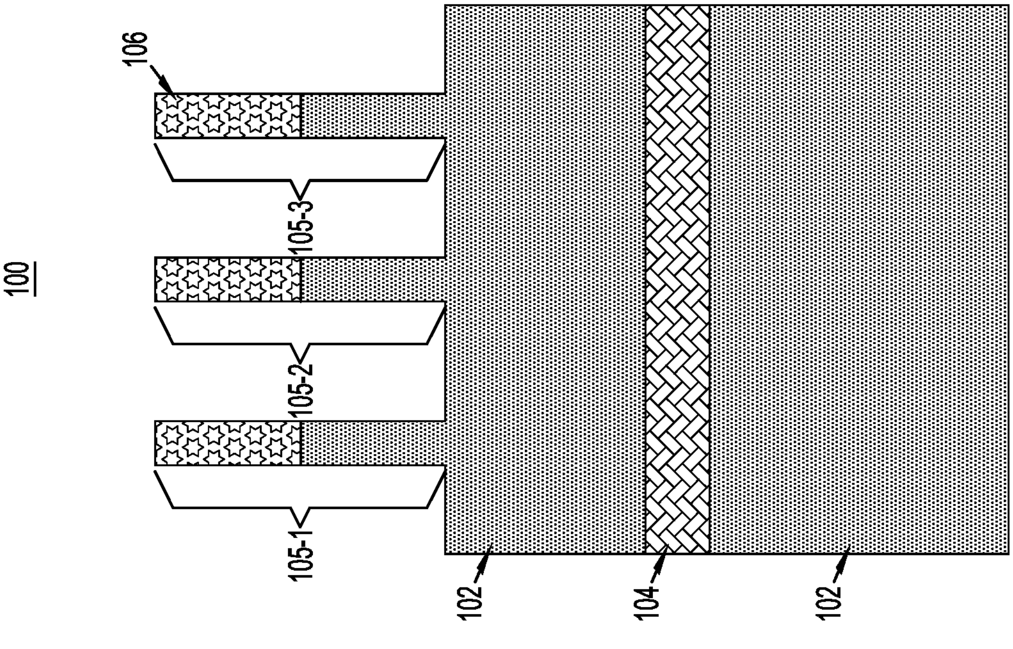
FIG. 2A is a cross-sectional view of the semiconductor structure taken along the X-X axis of FIG. 1A for use at a second-intermediate fabrication stage, according to an illustrative embodiment.

FIGS. 2A and 2B illustrate the semiconductor structure 100 for use at a second-intermediate fabrication stage. During this stage, sets of vertical fins 105A and 105B are formed. Although three vertical fins for the sets of vertical fins 105A and 105B are shown, the number of fins should not be considered limiting. In addition, although two sets of vertical fins, i.e., a first set of vertical fins 105A and a second set of vertical fins 105B are shown, the number of sets of vertical fins should not be considered limiting and any number are contemplated.

The sets of vertical fins 105A and 105B may be formed by first depositing a hard mask layer 106 on the substrate 102. The material of the hard mask layer 106 may include SiN, a multi-layer of SiN and $SiO_2$, or another suitable material.

Next, vertical fins 105-1, 105-2 and 105-3 (collectively referred to as vertical fins 105) for the sets of vertical fins 105A and 105B are formed using, for example, an anisotropic etch such as reactive ion etching (RIE) that selectively removes material from the substrate 102 in regions that are not protected by the hard mask layer 106. As used herein, the term "selective" in reference to a material removal process denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point in the present embodiment include ion beam etching, plasma etching or laser ablation. Alternatively, the vertical fins 105 can be formed by spacer imaging transfer.

Figure 3A:
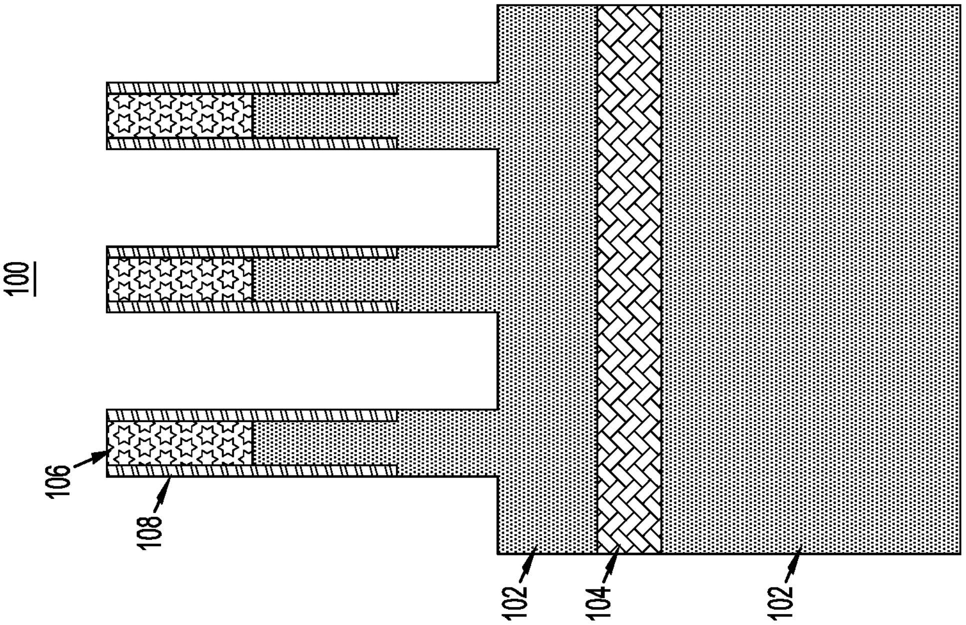
FIG. 3A is a cross-sectional view of the semiconductor structure taken along the X-X axis of FIG. 1A for use at a third-intermediate fabrication stage, according to an illustrative embodiment.
Figure 3B:
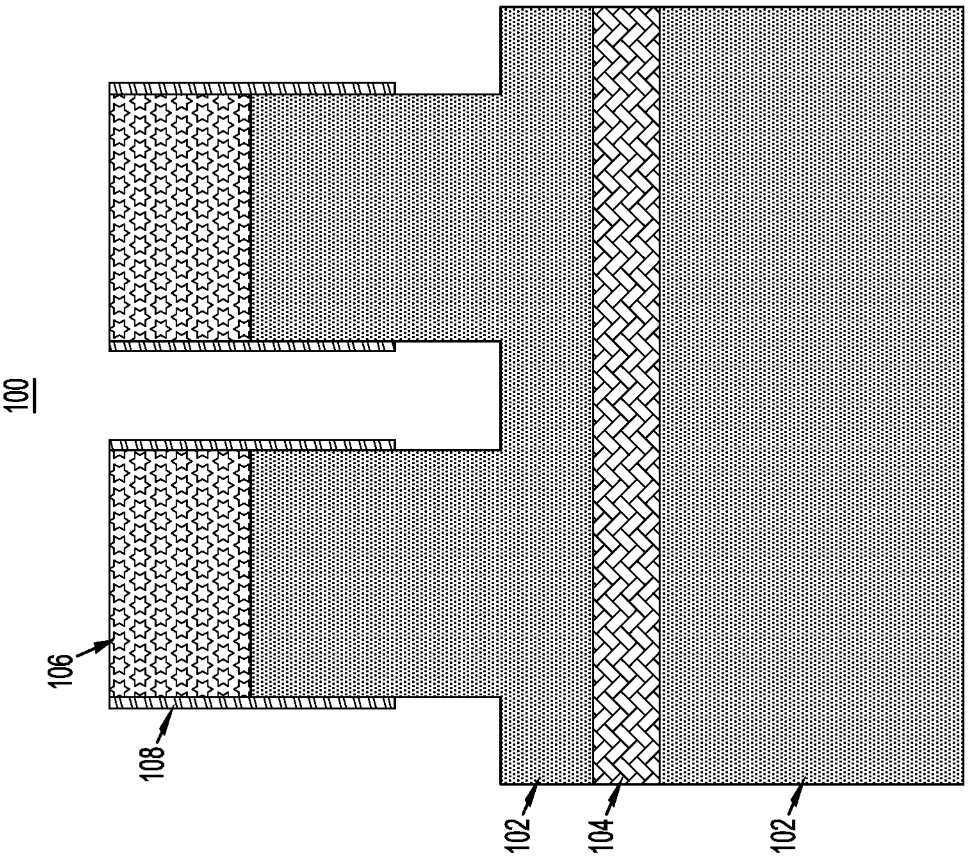
FIG. 3B is a cross-sectional view of the semiconductor structure taken along the Y-Y axis of FIG. 1A for use at the third-intermediate fabrication stage, according to an illustrative embodiment.

FIGS. 3A and 3B illustrate the semiconductor structure 100 at a third-intermediate fabrication stage. During this stage, sidewall spacers 108 are formed by conformal dielectric liner deposition and anisotropic dielectric liner etching. Sidewall spacers 108 may be formed of any suitable insulator, such as SiN, silicon boron carbide nitride (SiBCN), silicon oxycarbonitride (SiOCN), etc. Next, a portion of the substrate 102 is recessed using, for example, a wet or dry etch.

Figure 4B:
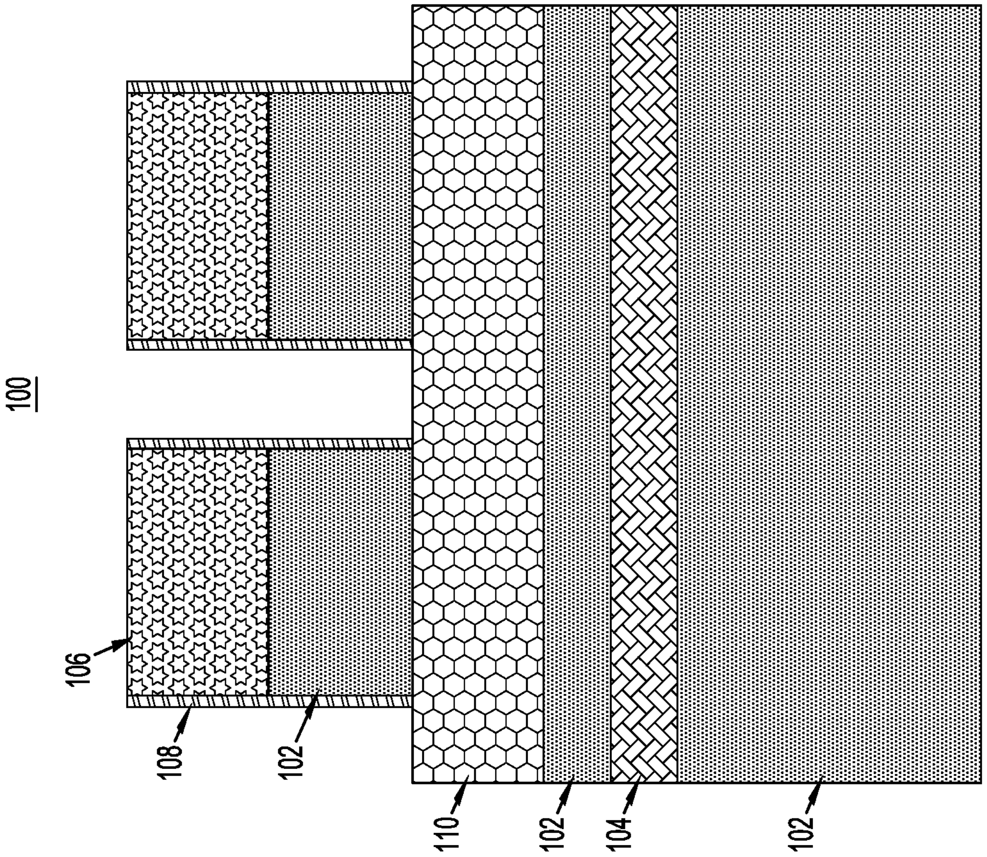
FIG. 4B is a cross-sectional view of the semiconductor structure taken along the Y-Y axis of FIG. 1A for use at the fourth-intermediate fabrication stage, according to an illustrative embodiment.
Figure 4A:
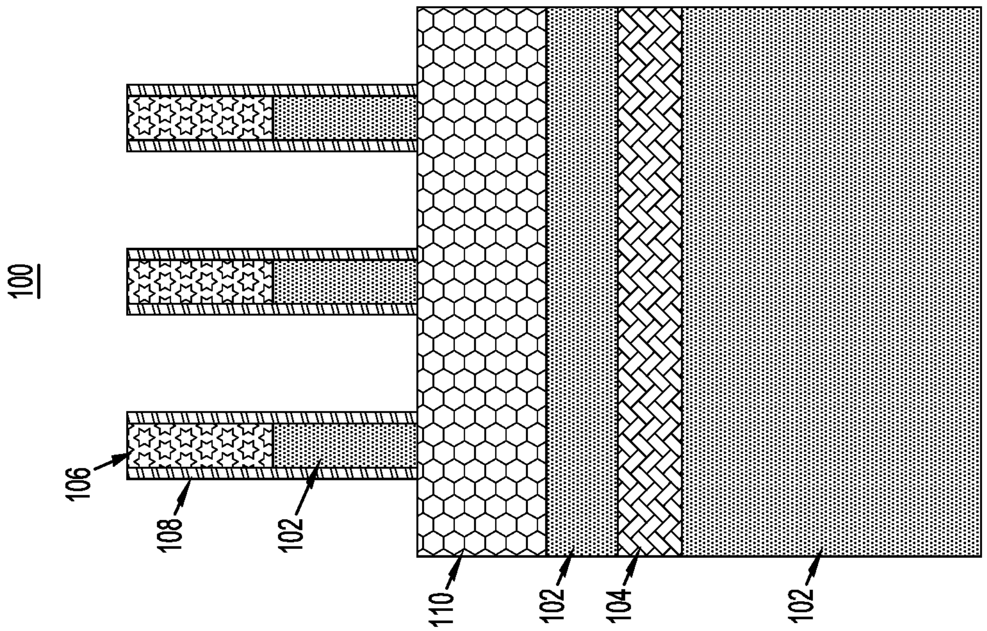
FIG. 4A is a cross-sectional view of the semiconductor structure taken along the X-X axis of FIG. 1A for use at a fourth-intermediate fabrication stage, according to an illustrative embodiment.

FIGS. 4A and 4B illustrate the semiconductor structure 100 at a fourth-intermediate fabrication stage. During this stage, a bottom source/drain region 110 is formed in the substrate 102 and between adjacent vertical fins and in the recessed portion of the substrate 102. The bottom source/drain region 110 is formed in the recessed portion of the substrate 102 by, for example, epitaxial growth processes.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The epitaxially grown bottom source/drain region 110 can be in-situ doped, meaning dopants are incorporated into the epitaxy film during the epitaxy process. In some embodiments, after epi formation, drive-in anneals can be applied to move the dopants closer to the bottom of the fin channels. For example, a thermal anneal process includes exposing the bottom source/drain region 110 to a flash formation anneal process. The flash formation anneal process may generate temperatures ranging from approximately 1000° C. to approximately 1250° C. for approximately 1 millisecond (ms) to 200 ms. Dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 110 can be boron doped SiGe for a p-type field-effect transistor (P-FET) or phosphorous doped silicon for an n-type field-effect transistor (N-FET). It is to be understood that the term "source/drain region" as used herein means that a given source/drain region can be either a source region or a drain region, depending on the application.

Figure 5B:
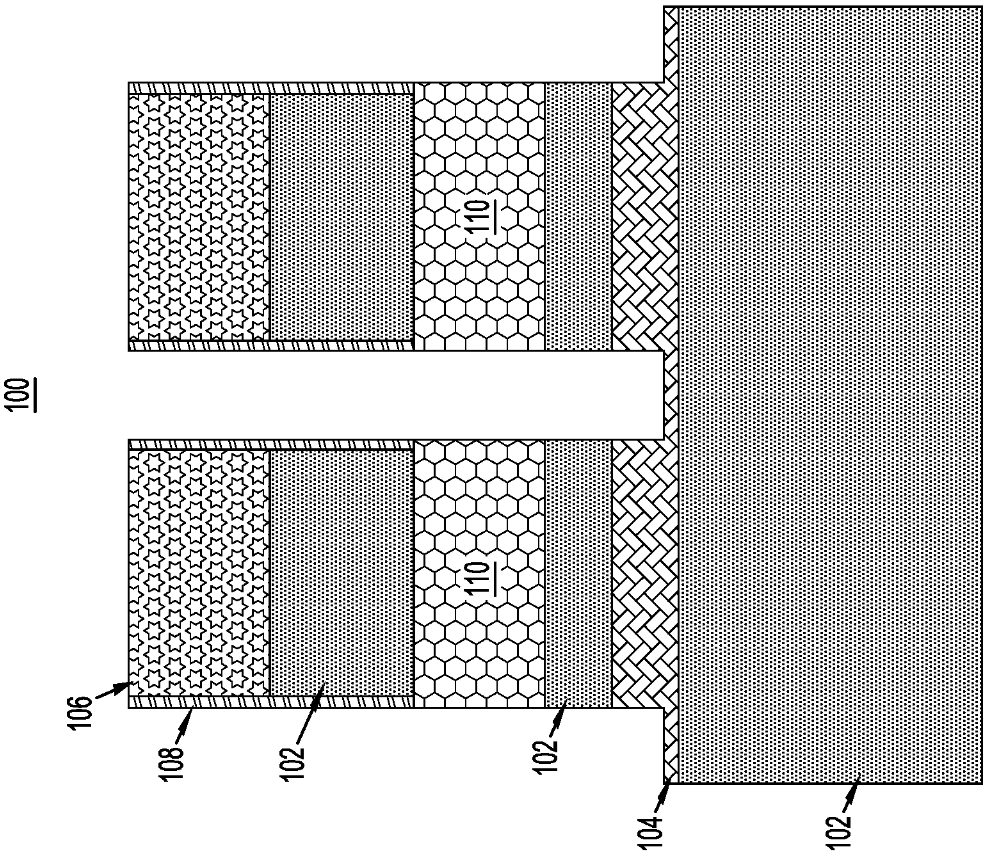
FIG. 5B is a cross-sectional view of the semiconductor structure taken along the Y-Y axis of FIG. 1A for use at the fifth-intermediate fabrication stage, according to an illustrative embodiment.
Figure 5A:
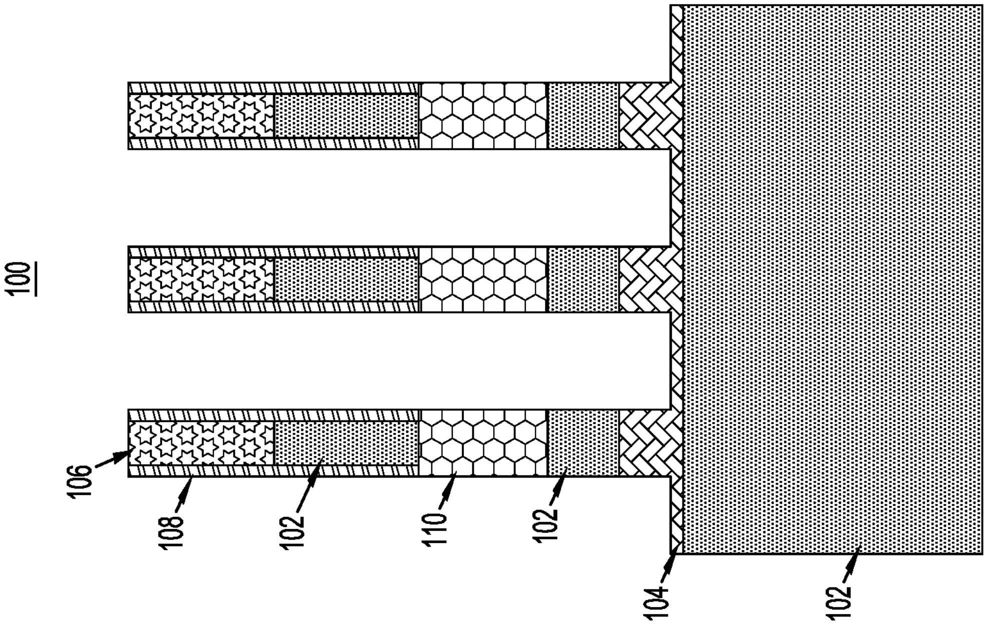
FIG. 5A is a cross-sectional view of the semiconductor structure taken along the X-X axis of FIG. 1A for use at a fifth-intermediate fabrication stage, according to an illustrative embodiment.

FIGS. 5A and 5B illustrate the semiconductor structure 100 at a fifth-intermediate fabrication stage. During this stage, the semiconductor structure 100 is subjected to lithographic patterning to etch through the bottom source/drain region 110 and the substrate 102 and through a portion of the etch stop layer 104 using, for example, RIE.

Figure 6B:
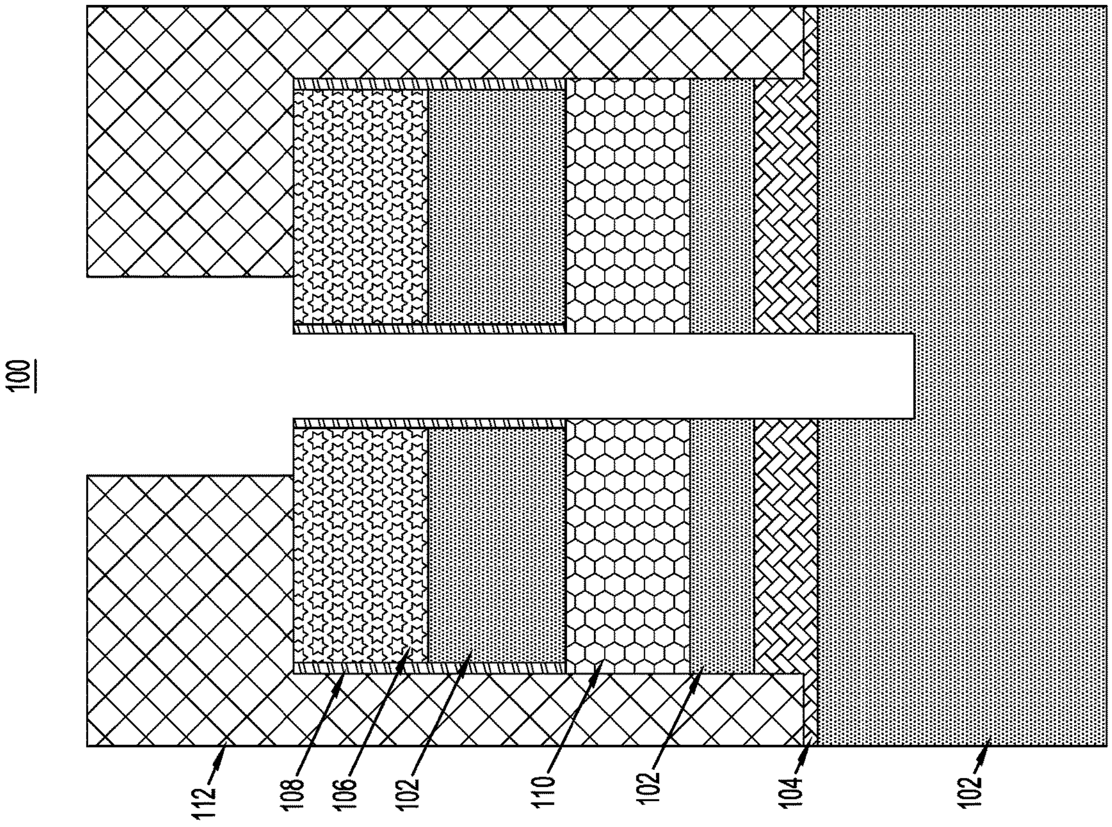
FIG. 6B is a cross-sectional view of the semiconductor structure taken along the Y-Y axis of FIG. 1A for use at the sixth-intermediate fabrication stage, according to an illustrative embodiment.
Figure 6A:
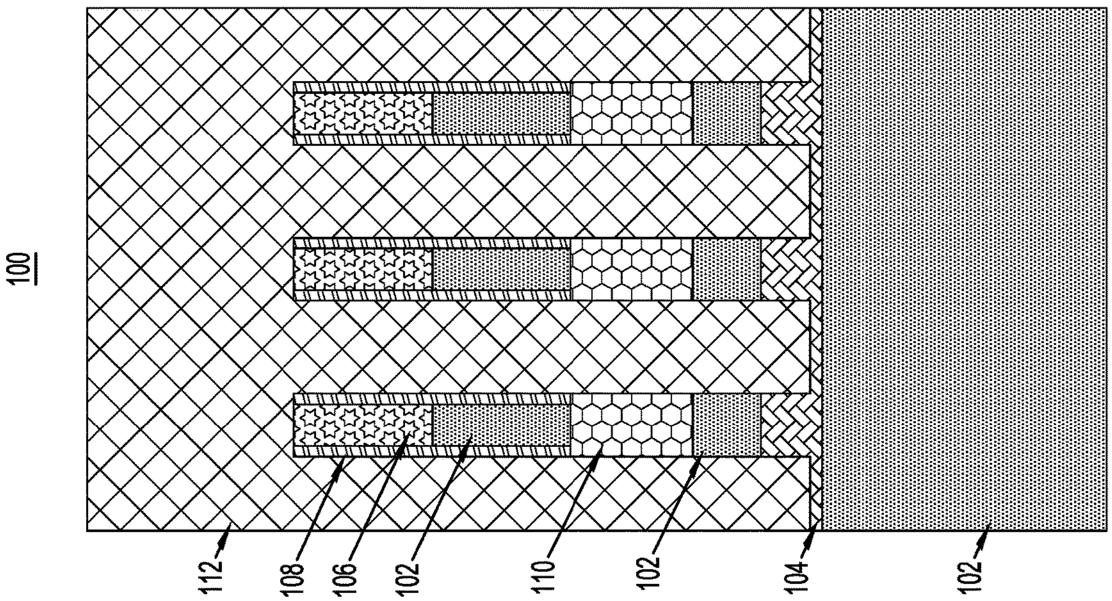
FIG. 6A is a cross-sectional view of the semiconductor structure taken along the X-X axis of FIG. 1A for use at a sixth-intermediate fabrication stage, according to an illustrative embodiment.

FIGS. 6A and 6B illustrate the semiconductor structure 100 at a sixth-intermediate fabrication stage. During this stage, a masking layer 112 (e.g., an organic planarization layer (OPL)) is first deposited, e.g., by spin-on coating, onto the semiconductor structure 100 and is baked at a suitable temperate ranging from about 100° C. to about 400° C. The masking layer 112 can be composed of a flowable organic material such as, for example, a spin-on-carbon (SOC). In illustrative embodiments, the masking layer 112 is self-leveling and can achieve planarization over the surface topography without the use of etching, CMP, or other conventional planarization techniques. In illustrative embodiments, the masking layer 112 may require multiple deposition processes, etching processes or optionally a CMP process to planarize the masking layer 112.

Following deposition, the masking layer 112 is subjected to a trench or opening patterning procedure, e.g., conventional lithographic and etching processes utilizing, e.g., an RIE process (with, e.g., a halogen-based plasma chemistry) to remove at least a segment of the masking layer 112 between opposing sidewalls of the sets of vertical fins 105A and 105B (see FIG. 2B) and thereby forming an opening therein and through the remaining portion of the etch stop layer 104 and into the substrate 102.

Figure 7B:
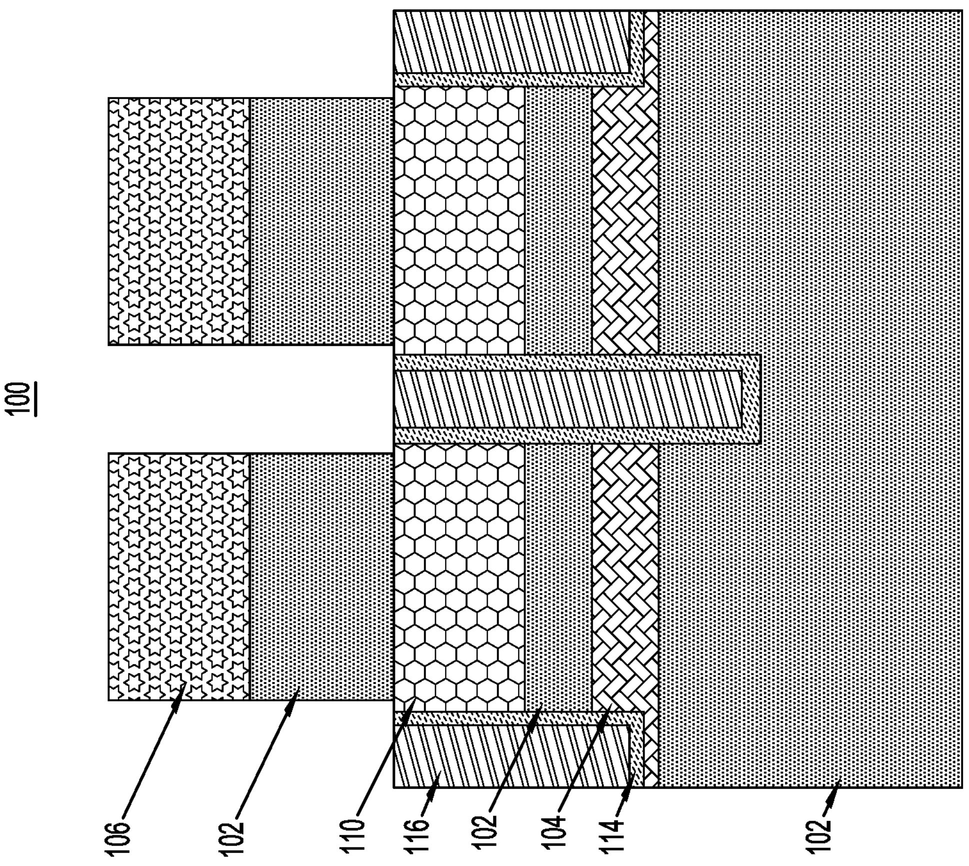
FIG. 7B is a cross-sectional view of the semiconductor structure taken along the Y-Y axis of FIG. 1A for use at the seventh-intermediate fabrication stage, according to an illustrative embodiment.
Figure 7A:
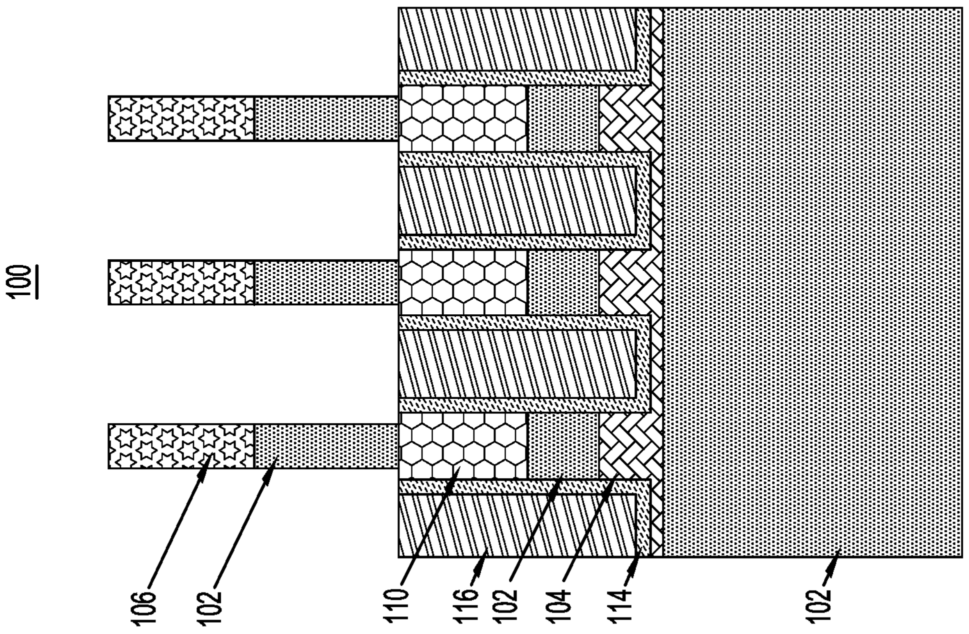
FIG. 7A is a cross-sectional view of the semiconductor structure taken along the X-X axis of FIG. 1A for use at a seventh-intermediate fabrication stage, according to an illustrative embodiment.

FIGS. 7A and 7B illustrate the semiconductor structure 100 at a seventh-intermediate fabrication stage. During this stage, the remaining masking layer 112 is removed by, for example, an ash etching process. In illustrative embodiments, the etching material can be an oxygen ash or a nitrogen or hydrogen-based chemistry including, e.g., nitrogen gas or hydrogen gas, or a combination thereof. The ash etching process removes the remaining masking layer 112 with little or no gouging of the underlying components of the semiconductor structure 100.

Figure 8B:
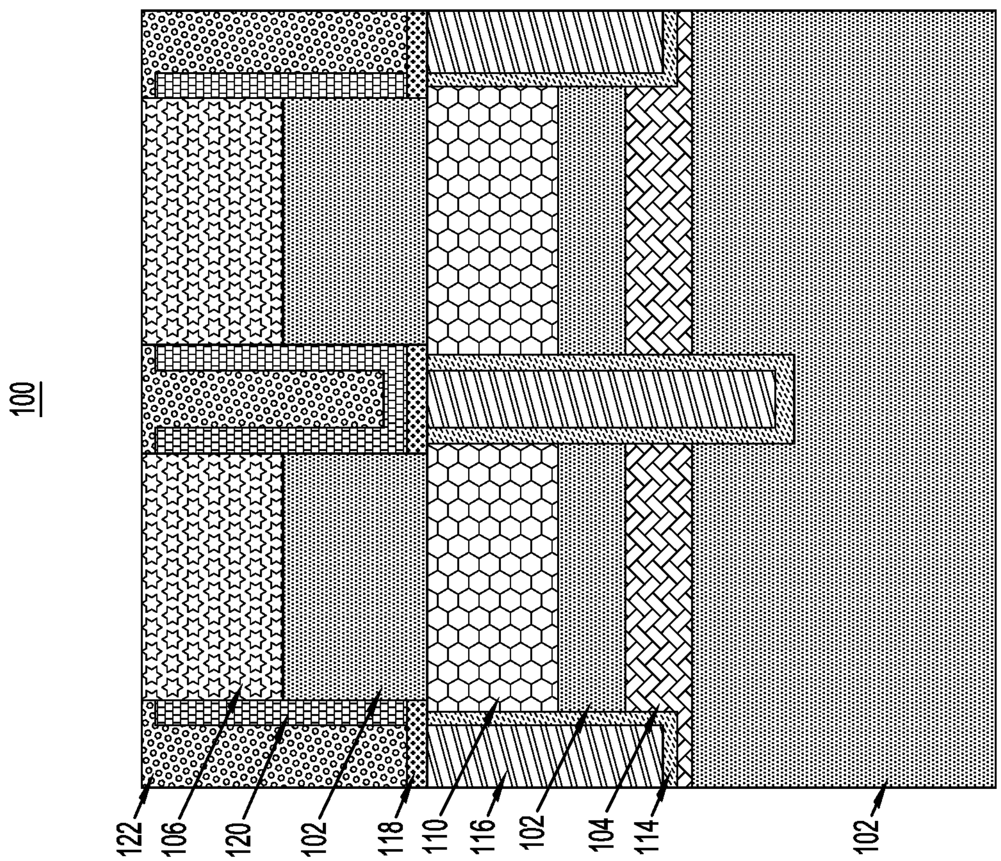
FIG. 8B is a cross-sectional view of the semiconductor structure taken along the Y-Y axis of FIG. 1A for use at the eighth-intermediate fabrication stage, according to an illustrative embodiment.
Figure 8A:
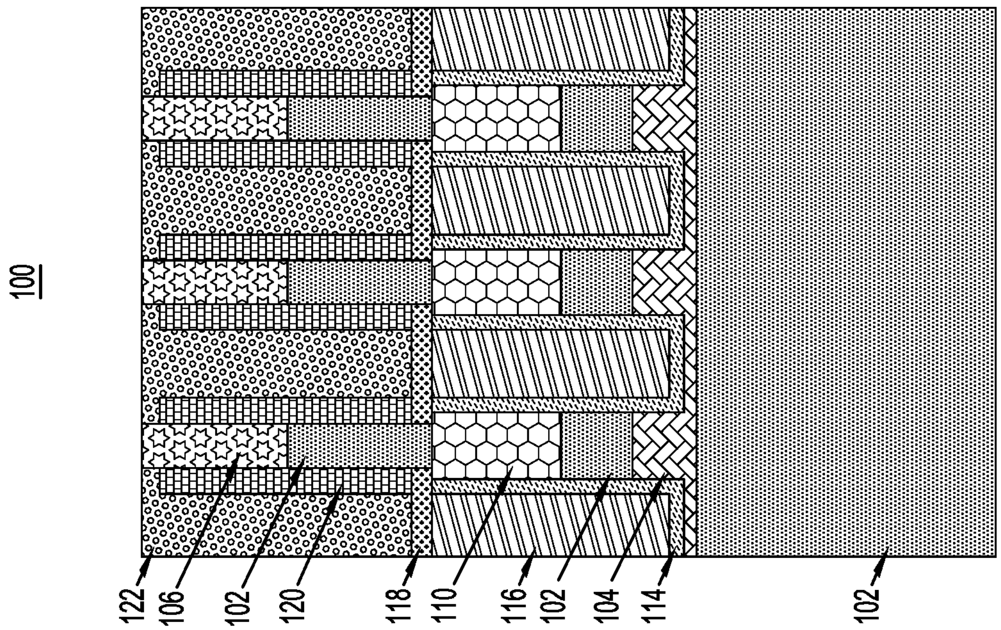
FIG. 8A is a cross-sectional view of the semiconductor structure taken along the X-X axis of FIG. 1A for use at an eighth-intermediate fabrication stage, according to an illustrative embodiment.

Next, a shallow trench isolation (STI) liner layer 114 and STI regions 116 can be formed on the substrate 102. The STI liner layer 114 includes, for example, SiN, and the STI regions 116 includes a dielectric material such as silicon oxide or silicon oxynitride, and are formed by methods known in the art. For example, in one illustrative embodiment, the STI regions 116 are a shallow trench isolation oxide layer. The STI liner layer 114 and the STI regions 116 are recessed to be coplanar with the top surface of the bottom source/drain region 110. The sidewall spacers 108 are then removed utilizing any conventional technique such as a wet or dry etching process, FIGS. 8A and 8B illustrate the semiconductor structure 100 at an eighth-intermediate fabrication stage. During this stage, a bottom spacer layer 118 is formed on the STI regions 116 and a portion of the bottom source/drain region 110. Suitable material for the bottom spacer layer 118 includes, for example, silicon boron nitride (SiBN), siliconborocarbonitride (SiBCN), silicon oxycarbonitride (SiOCN), SiN and $SiO_x$. The bottom spacer layer 118 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the bottom spacer layer 118 can be formed by overfilling the space with dielectric materials, followed by chemical mechanical planarization (CMP) and dielectric recess.

Next, a gate structure 120 is formed on the bottom spacer layer 118 and around each of the vertical fins 105 (see FIG. 2A) of the sets of vertical fins 105A and 105B (see FIG. 2B). In illustrative embodiments, the gate structure 120 is deposited on the bottom spacer layer 118 and around the vertical fins 105 employing, for example, ALD, CVD, RFCVD, plasma enhanced CVD (PECVD), physical vapor deposition (PVD), or molecular layer deposition (MLD).

The gate structure 120 may include, for example, a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The gate structure 120 is then patterned to remove unwanted gate stack materials using conventional lithography and RIE techniques. An interlevel dielectric (ILD) layer 122 is then deposited. The ILD layer 122 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high-density plasma oxide, borophosphosilicate glass (BPSG), or any combination thereof. The ILD layer 122 may be formed in the trenches using any suitable deposition techniques including CVD, ALD, PVD, PECVD, chemical solution deposition or other like processes. The ILD layer 122 is then planarized by, for example, a planarization process such as CMP.

Figure 9B:
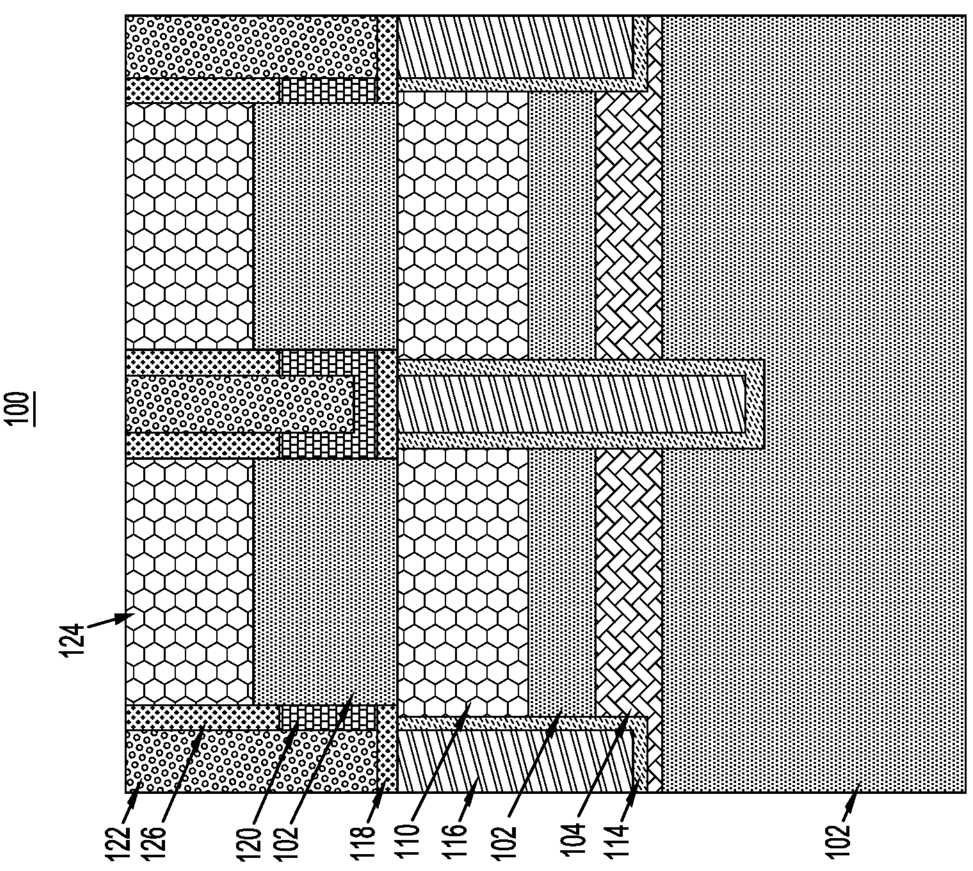
FIG. 9B is a cross-sectional view of the semiconductor structure taken along the Y-Y axis of FIG. 1A for use at the ninth-intermediate fabrication stage, according to an illustrative embodiment.
Figure 9A:
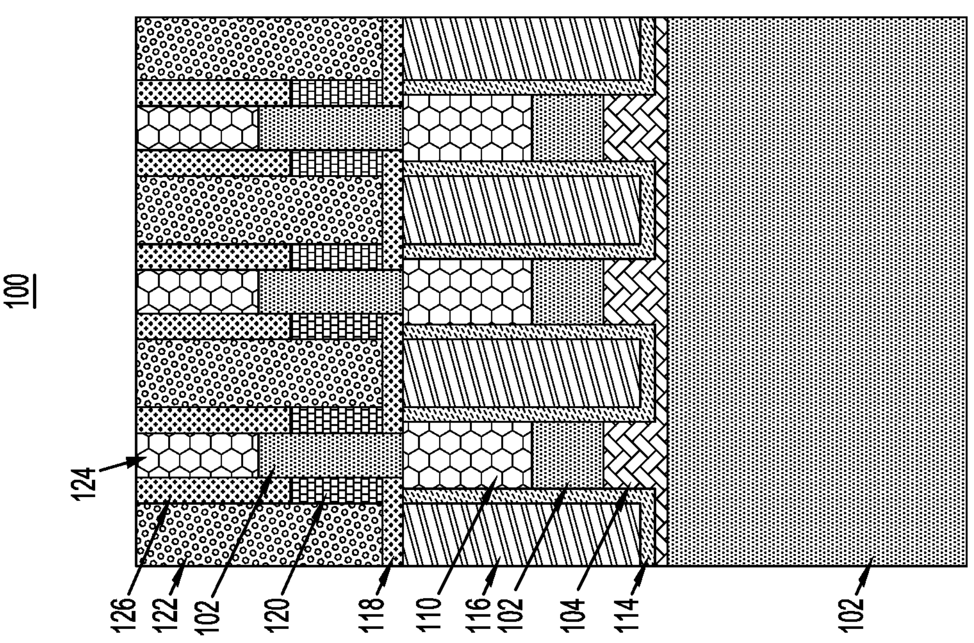
FIG. 9A is a cross-sectional view of the semiconductor structure taken along the X-X axis of FIG. 1A for use at a ninth-intermediate fabrication stage, according to an illustrative embodiment.

FIGS. 9A and 9B illustrate the semiconductor structure 100 at a ninth-intermediate fabrication stage. During this stage, the hard mask layer 106 is removed from the vertical fins 105 (see FIG. 2A) and the gate structure 120 is selectively recessed by any conventional etching process to expose a top portion of each vertical fin of the sets of vertical fins 105A and 105B (see FIG. 2B). Suitable etching processes include, for example, a dry etch process such as plasma etching or RIE, or a wet etching, that are selective to the gate structure 120 relative to the ILD layer 122.

A top spacer 126 is then formed on the gate structure 120 and sidewalls of the ILD layer 122 and exposing the top portion of each vertical fin 105 (see FIG. 2A) of the sets of vertical fins 105A and 105B (see FIG. 2B). The top spacer 126 includes, for example, silicon nitride (SiN), silicon boron nitride (SiBN), siliconborocarbonitride (SiBCN), or silicon oxycarbonitride (SiOCN). In illustrative embodiments, the top spacer 126 is conformally deposited using deposition techniques including, for example, CVD, PECVD, RFCVD, PVD, ALD, MLD, MBD, PLD, LSMCD, sputtering, and/or plating.

A top source/drain region 124 is formed on the exposed top portion of each vertical fin 105-1, 105-2 and 105-3 (see FIG. 2A) of the sets of vertical fins 105A and 105B (see FIG. 2B). The top source/drain region 124 is epitaxially grown from the upper portions of the exposed fins using epitaxial growth processes as described above. The top source/drain region 124 can be formed in different epitaxial growth processes from each other and can be in-situ doped to be either a P-FET, or N-FET. In non-limiting illustrative embodiments, FIG. 9B, viewed in connection with FIGS. 1A and 2B, shows that the top source/drain region 124 and the bottom source/drain region 110 for the set of vertical fins 105A are a P-FET region, and the top source/drain region 124 and the bottom source/drain region 110 for the set of vertical fins 105B are an N-FET region. However, it is contemplated that the top source/drain region 124 and the bottom source/drain region 110 for the set of vertical fins 105A can be an N-FET region, and the top source/drain region 124 and the bottom source/drain region 110 for the set of vertical fins 105B can be a P-FET region.

Figure 10B:
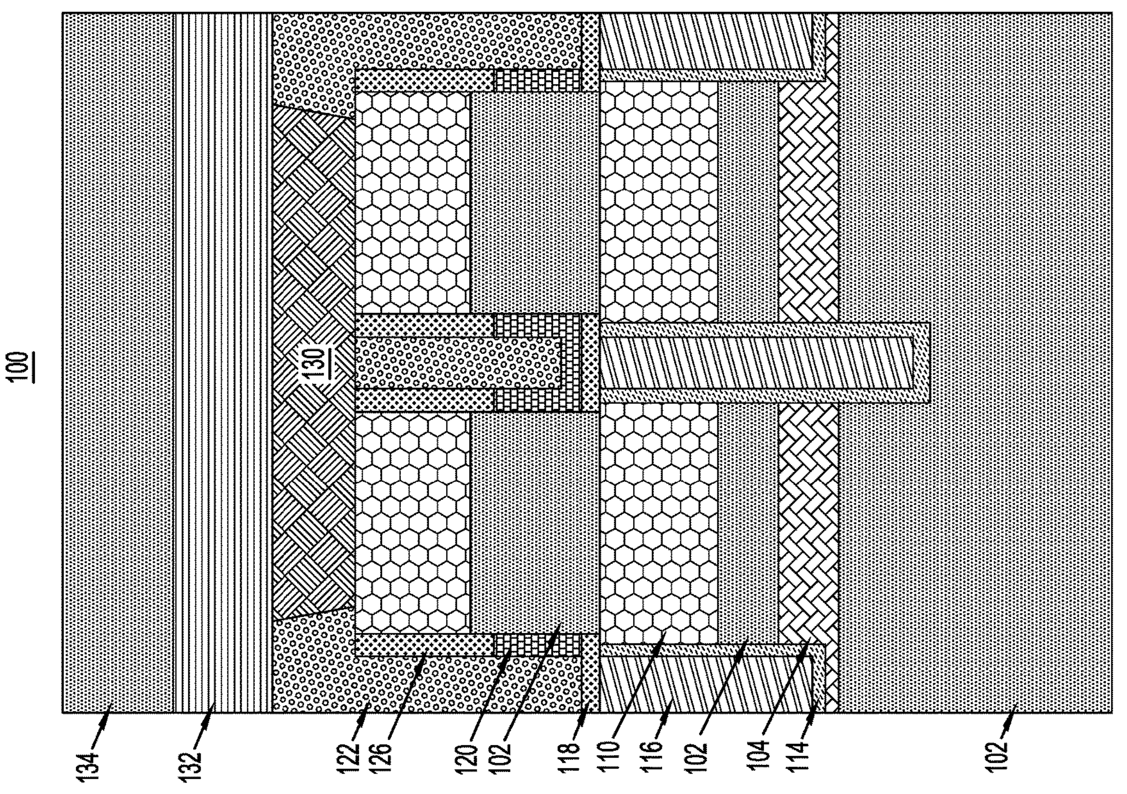
FIG. 10B is a cross-sectional view of the semiconductor structure taken along the Y-Y axis of FIG. 1A for use at the tenth-intermediate fabrication stage, according to an illustrative embodiment.
Figure 10A:
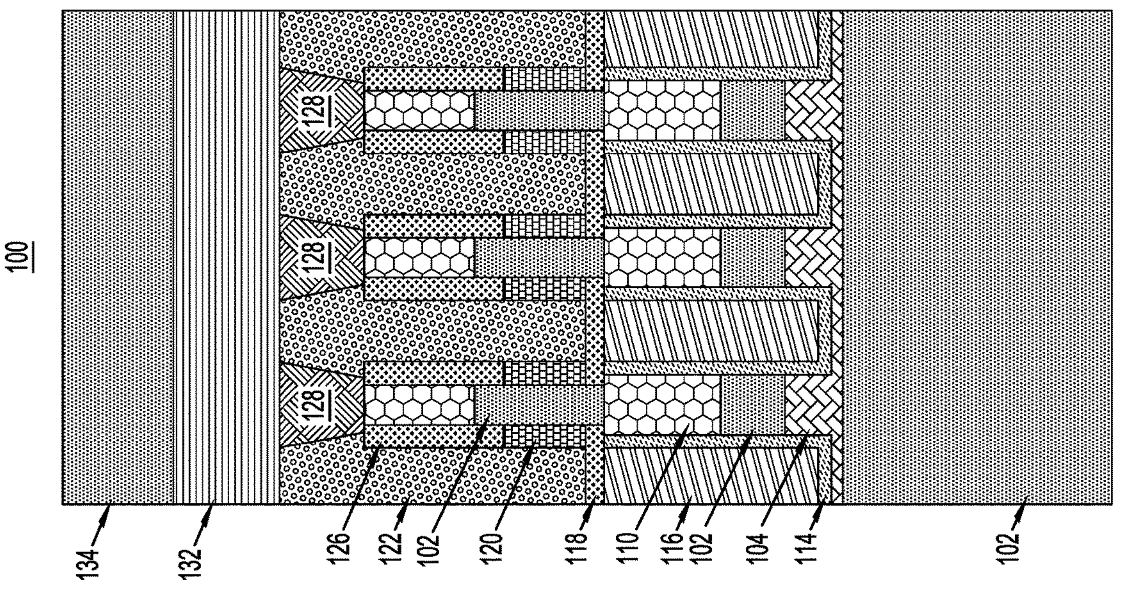
FIG. 10A is a cross-sectional view of the semiconductor structure taken along the X-X axis of FIG. 1A for use at a tenth-intermediate fabrication stage, according to an illustrative embodiment.

FIGS. 10A and 10B illustrate the semiconductor structure 100 at a tenth-intermediate fabrication stage. During this stage, middle-of-the-line contacts including top source/drain contacts 128 and 130 are formed by any conventional technique. For example, an additional layer of the ILD layer 122 is first deposited on the top surface of the semiconductor structure 100. The top source/drain contacts 128 and 130 can be formed by patterning ILD layer 122 and utilizing conventional lithographic and etching processes to form a via. Next, contact metallization is performed by, for example, forming a silicide liner, such as Ti, Ni, or NiPt, followed by an adhesion metal liner, such as TiN, TaN, followed by a conductive metal, such as tungsten (W), aluminum (Al), copper (Cu), cobalt (Co), ruthenium (Ru), molybdenum (Mo), or any other suitable conductive material. In various embodiments, the high conductance metal can be deposited by CVD, PVD, ALD, and/or plating. The contact metal can be planarized using, for example, a planarizing process such as CMP. Other planarization processes can include grinding and polishing.

Next, a frontside BEOL interconnect 132 is then formed on the semiconductor structure 100 utilizing conventional techniques. The frontside BEOL interconnect 132 includes various BEOL interconnect structures. A carrier wafer 134 may be formed of materials similar to that of the substrate 102, and may be formed over the frontside BEOL interconnect 132 using a wafer bonding process, such as dielectric-to-dielectric bonding.

Figure 11B:
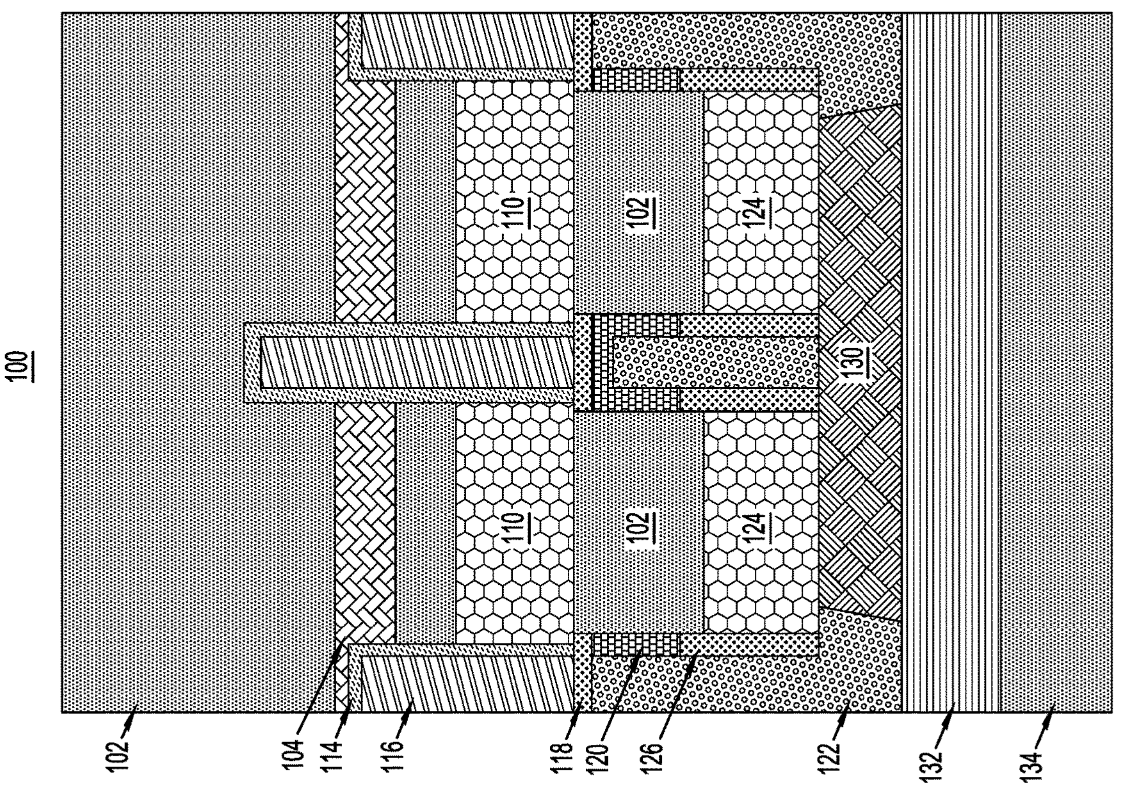
FIG. 11B is a cross-sectional view of the semiconductor structure taken along the Y-Y axis of FIG. 1A at the eleventh-intermediate fabrication stage, according to an illustrative embodiment.
Figure 11A:
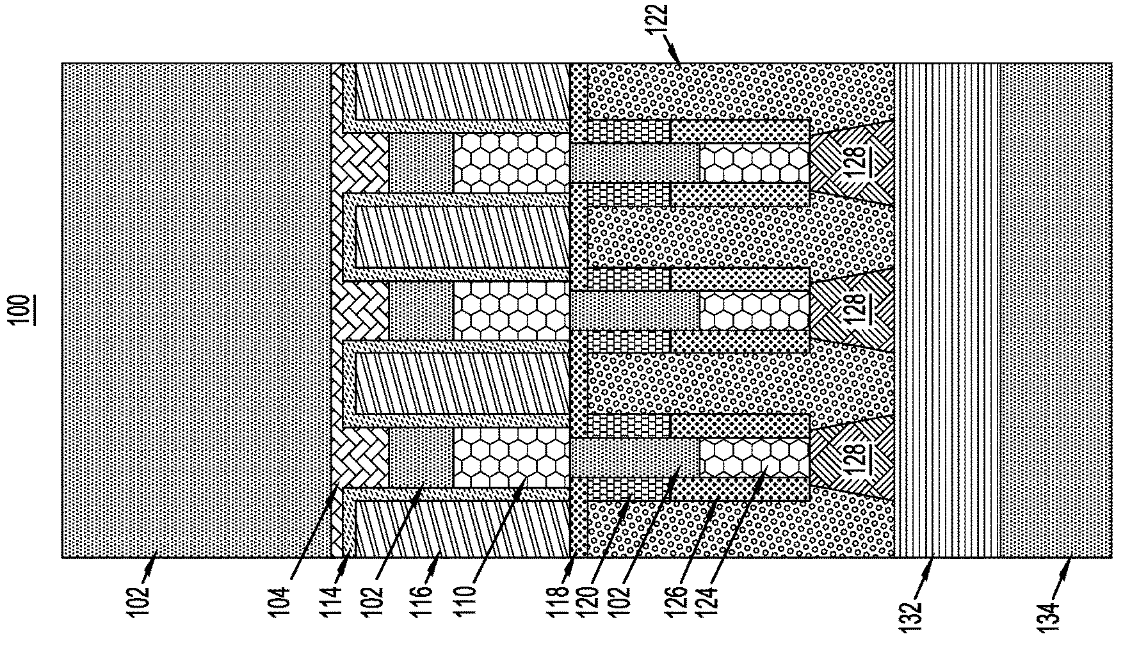
FIG. 11A is a cross-sectional view of the semiconductor structure taken along the X-X axis of FIG. 1A for use at an eleventh-intermediate fabrication stage, according to an illustrative embodiment.

FIGS. 11A and 11B illustrate the semiconductor structure 100 at an eleventh-intermediate fabrication stage. Using the carrier wafer 134, the structure may be "flipped" over so that the back side of the substrate 102 (i.e., the back surface) is facing up for back side processing as shown.

Figure 12B:
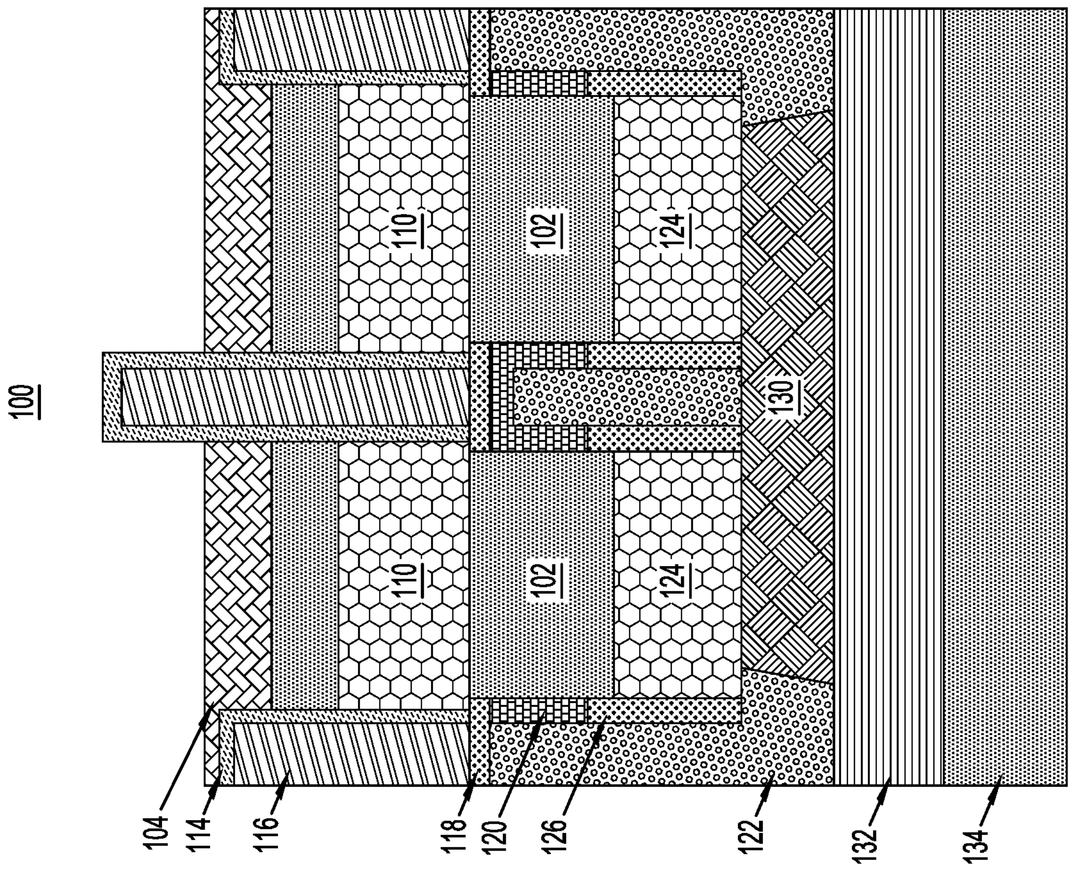
FIG. 12B is a cross-sectional view of the semiconductor structure taken along the Y-Y axis of FIG. 1A for use at the twelfth-intermediate fabrication stage, according to an illustrative embodiment.
Figure 12A:
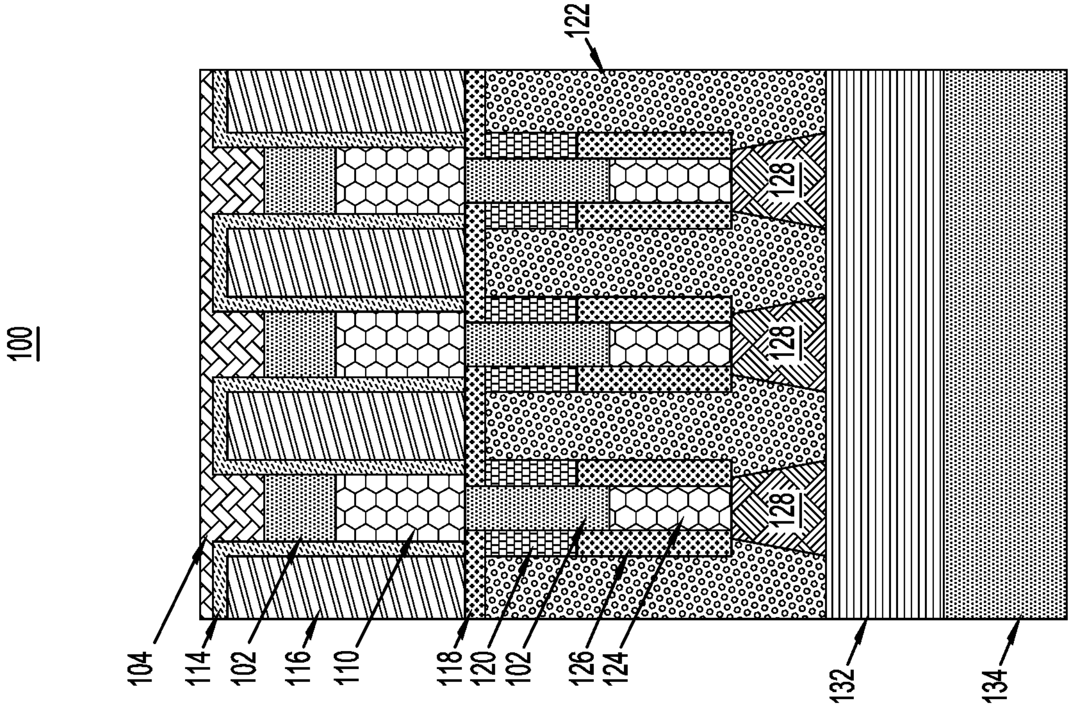
FIG. 12A is a cross-sectional view of the semiconductor structure taken along the X-X axis of FIG. 1A for use at a twelfth-intermediate fabrication stage, according to an illustrative embodiment.

FIGS. 12A and 12B illustrate the semiconductor structure 100 at a twelfth-intermediate fabrication stage. During this stage, and portions of the substrate 102 may be removed from the back side using, for example, a wet etch to selectively remove the substrate 102 until the etch stop layer 104 is reached. FIG. 12B shows that a portion of the STI liner layer 114 and the STI regions 116 is exposed between the PFET region and the NFET region.

Figure 13A:
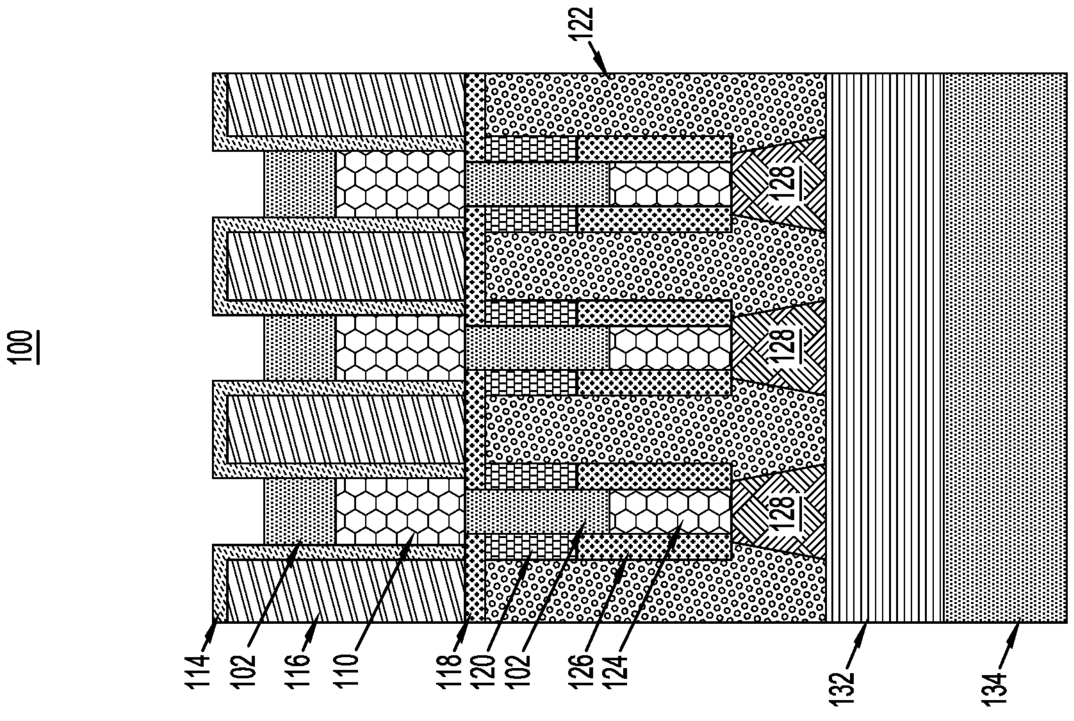
FIG. 13A is a cross-sectional view illustrating the semiconductor structure taken along the X-X axis of FIG. 1A at a thirteenth-intermediate fabrication stage, according to an illustrative embodiment.
Figure 13B:
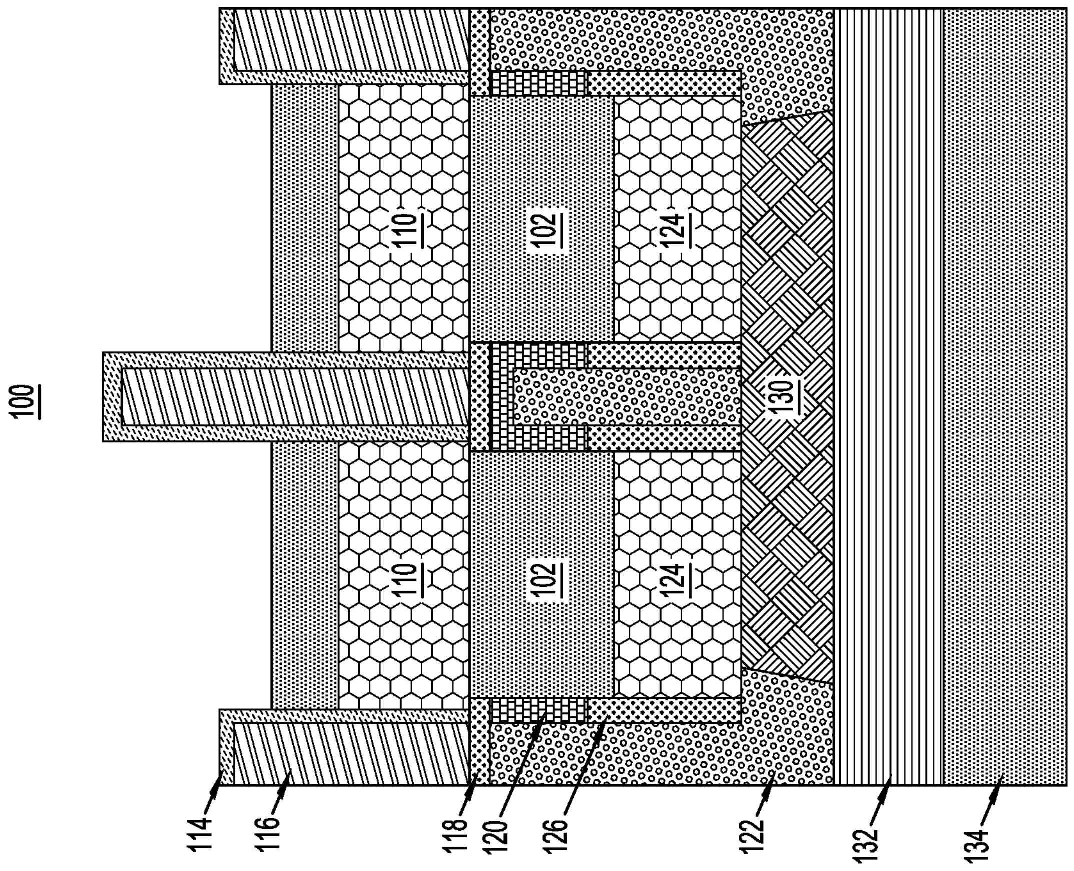
FIG. 13B is a cross-sectional view illustrating the semiconductor structure taken along the Y-Y axis of FIG. 1A at the thirteenth-intermediate fabrication stage, according to an illustrative embodiment.

FIGS. 13A and 13B illustrate the semiconductor structure 100 at a thirteenth-intermediate fabrication stage. During this stage, the etch stop layer 104 is selectively removed until the substrate 102 is reached. The etch stop layer 104 can be selectively removed utilizing any suitable wet or dry etching process.

Figure 14B:
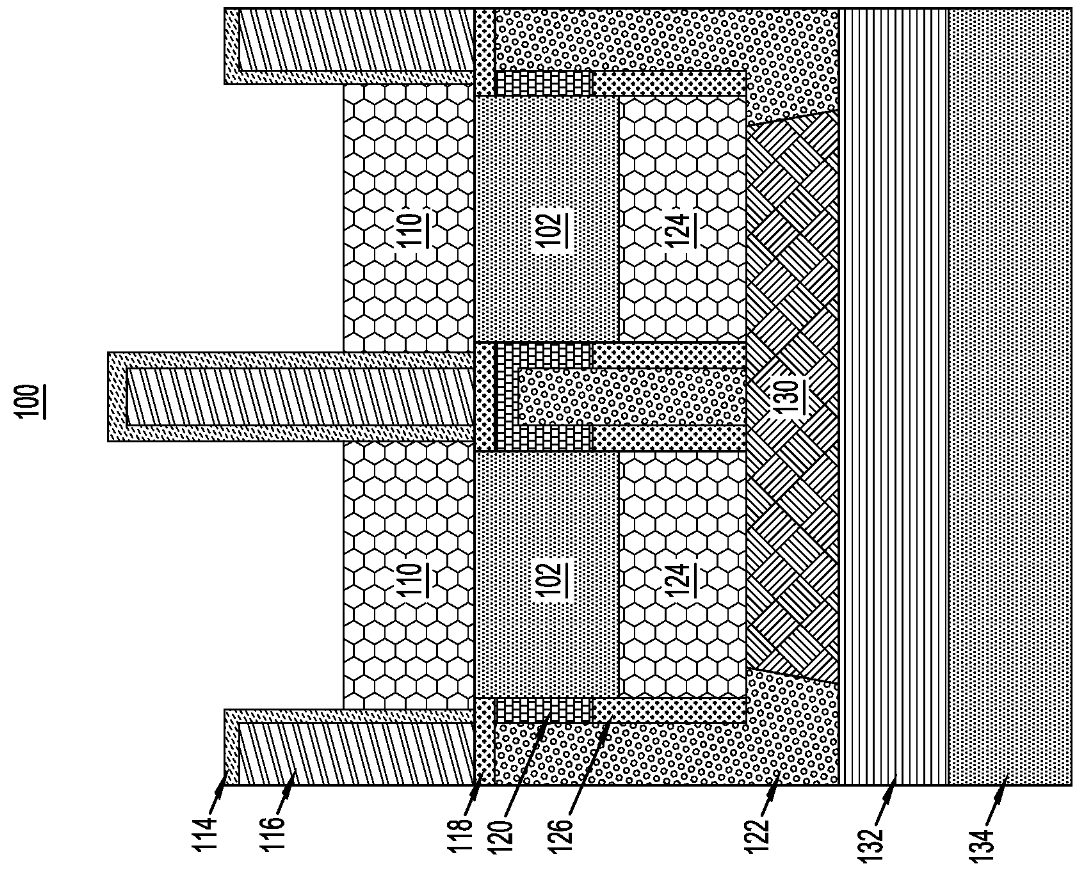
FIG. 14B is a cross-sectional view illustrating the semiconductor structure taken along the Y-Y axis of FIG. 1A at the fourteenth-intermediate fabrication stage, according to an illustrative embodiment.
Figure 14A:
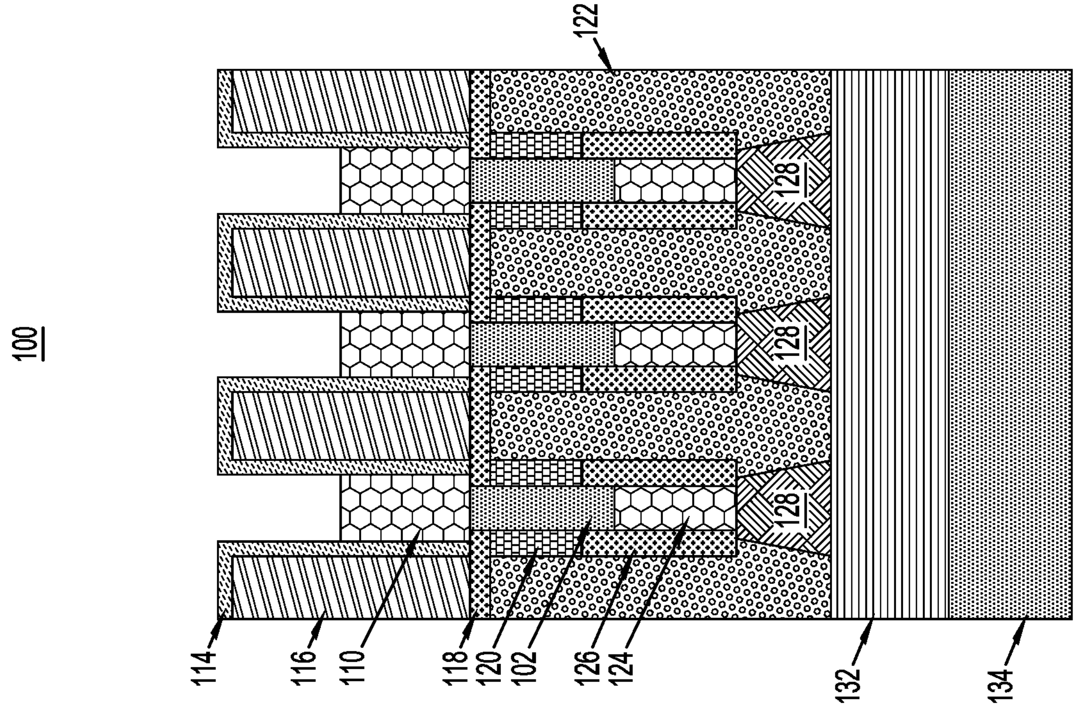
FIG. 14A is a cross-sectional view illustrating the semiconductor structure taken along the X-X axis of FIG. 1A at a fourteenth-intermediate fabrication stage, according to an illustrative embodiment.

FIGS. 14A and 14B illustrate the semiconductor structure 100 at a fourteenth-intermediate fabrication stage. During this stage, the remaining portions of the substrate 102 are are selectively removed utilizing any suitable wet or dry etching process.

Figure 15B:
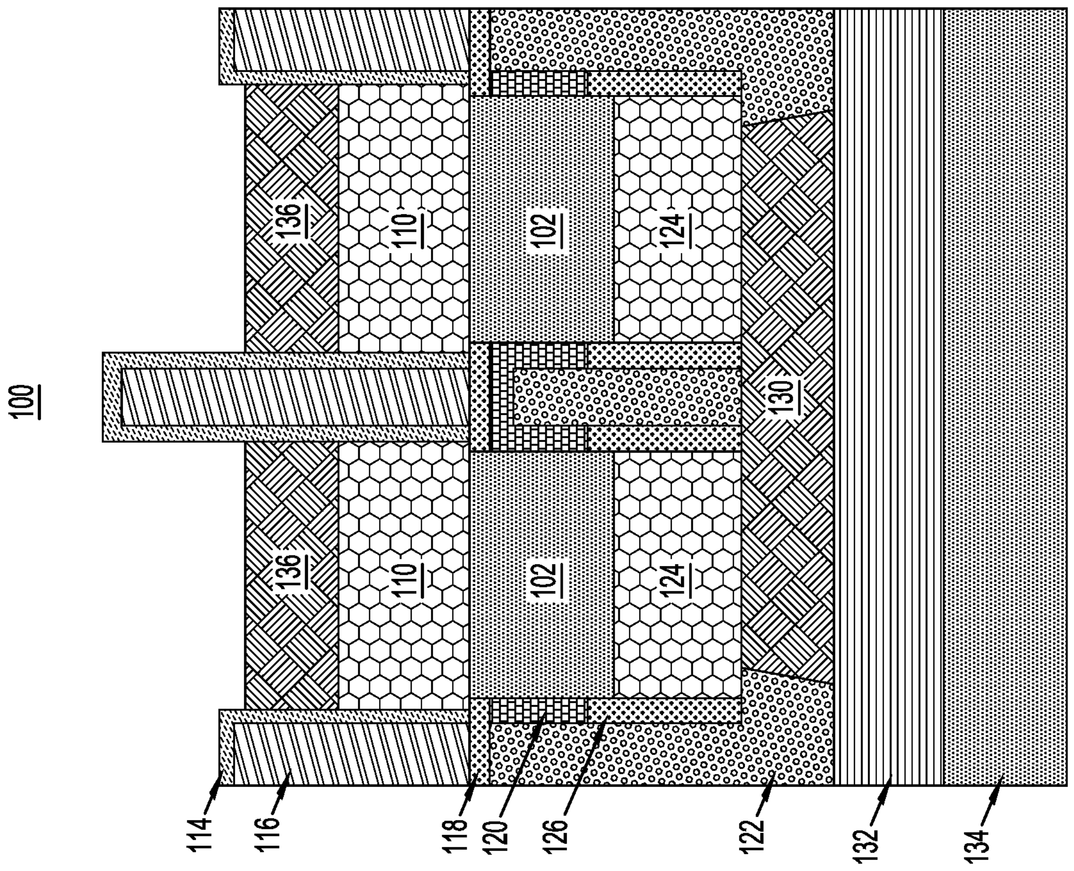
FIG. 15B is a cross-sectional view illustrating the semiconductor structure taken along the Y-Y axis of FIG. 1A at the fifteenth-intermediate fabrication stage, according to an illustrative embodiment.
Figure 15A:
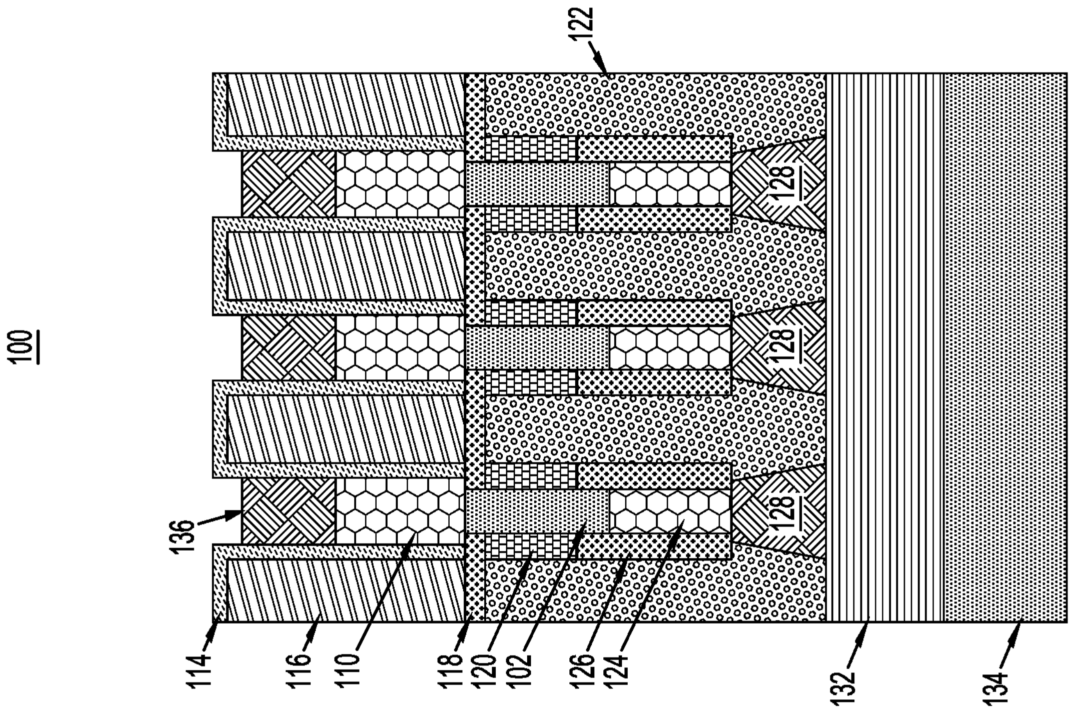
FIG. 15A is a cross-sectional view illustrating the semiconductor structure taken along the X-X axis of FIG. 1A at a fifteenth-intermediate fabrication stage, according to an illustrative embodiment.

FIGS. 15A and 15B illustrate the semiconductor structure 100 at a fifteenth-intermediate fabrication stage. During this stage, backside middle-of-the-line contacts 136 are first formed by any conventional technique. For example, the backside middle-of-the-line contacts 136 can be formed by depositing a conductive metal on the bottom source/drain region 110. Suitable conductive metals include, for example, conductive material such as, for example, tungsten (W), aluminum (Al), copper (Cu), cobalt (Co), ruthenium (Ru), molybdenum (Mo), or any other suitable conductive material. In various embodiments, the conductive metal can be deposited by ALD, CVD, PVD, and/or plating. The conductive metal can be planarized using, for example, a planarizing process such as CMP and recessed. Other planarization processes can include grinding and polishing. FIGS. 15A and 15B further show that the backside middle-of-the-line contacts 136 and the bottom source/drain region 110 are at a first level of the semiconductor structure 100 and the gate structure 120 is at a second level of the semiconductor structure 100 different than the first level.

Figure 16B:
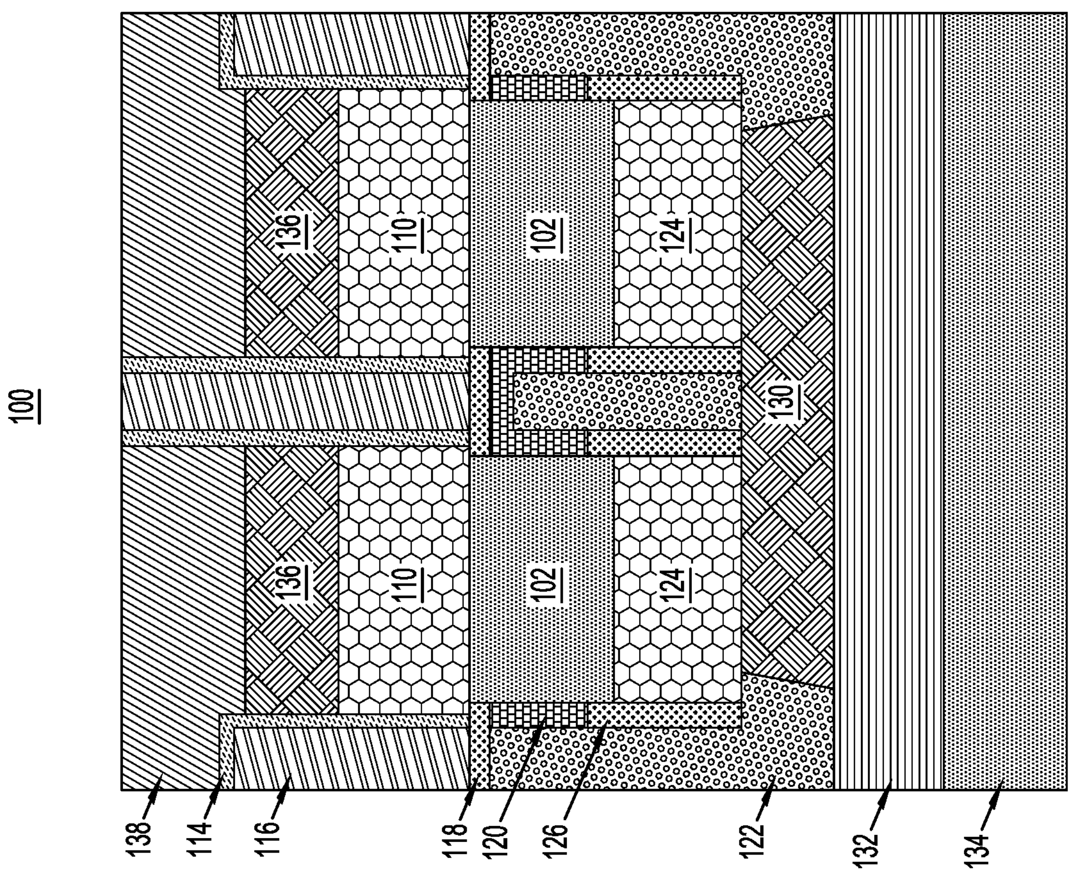
FIG. 16B is a cross-sectional view illustrating the semiconductor structure taken along the Y-Y axis of FIG. 1A at the sixteenth-intermediate fabrication stage, according to an illustrative embodiment.
Figure 16A:
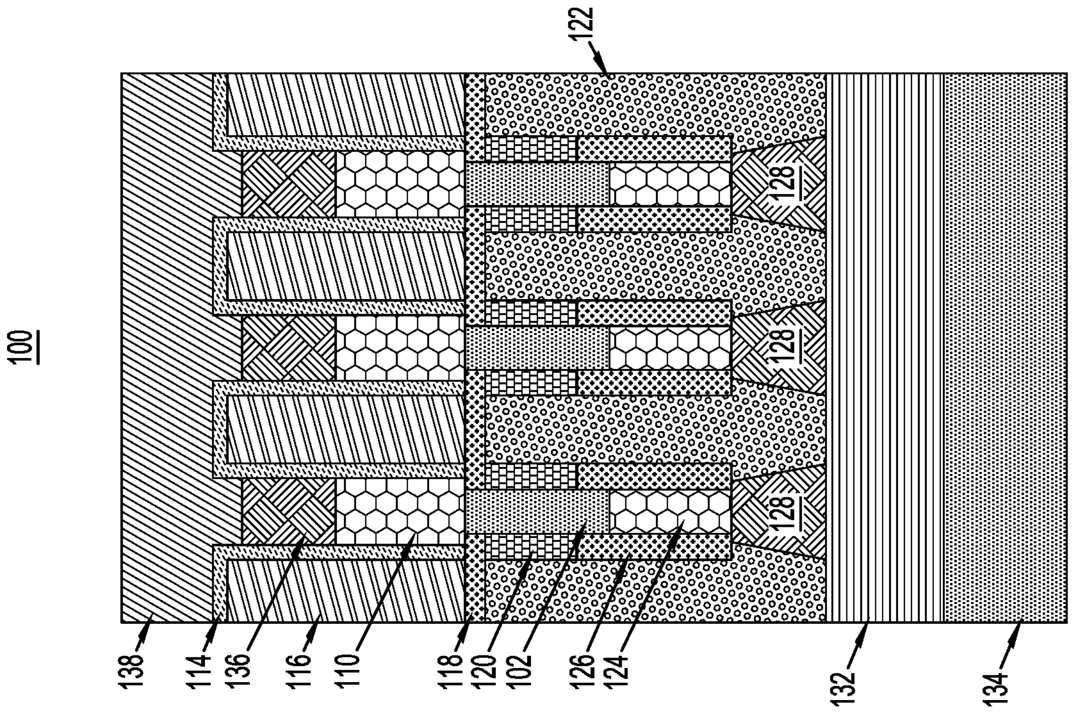
FIG. 16A is a cross-sectional view illustrating the semiconductor structure taken along the X-X axis of FIG. 1A at a sixteenth-intermediate fabrication stage, according to an illustrative embodiment.

FIGS. 16A and 16B illustrate the semiconductor structure 100 at a sixteenth-intermediate fabrication stage. During this stage, a backside ILD layer 138 is deposited over the semiconductor structure 100 using any conventional deposition technique such as by ALD, CVD, PVD, etc. The backside ILD layer 138 can be formed of a dielectric material that is different than the material for the STI liner layer 114 and the STI regions 116. In an illustrative embodiment, the backside ILD layer 138 can be formed from SiCO. Following formation of the backside ILD layer 138, any overfill can be removed by a planarization process such as CMP so that the backside ILD layer 138 is coplanar with the STI liner layer 114 and the STI regions 116 between the PFET region and the NFET region (see FIG. 16B). FIG. 16B shows that the top surfaces of the STI liner layer 114 and the STI regions 116 between the PFET region and the NFET region are exposed.

Figure 17B:
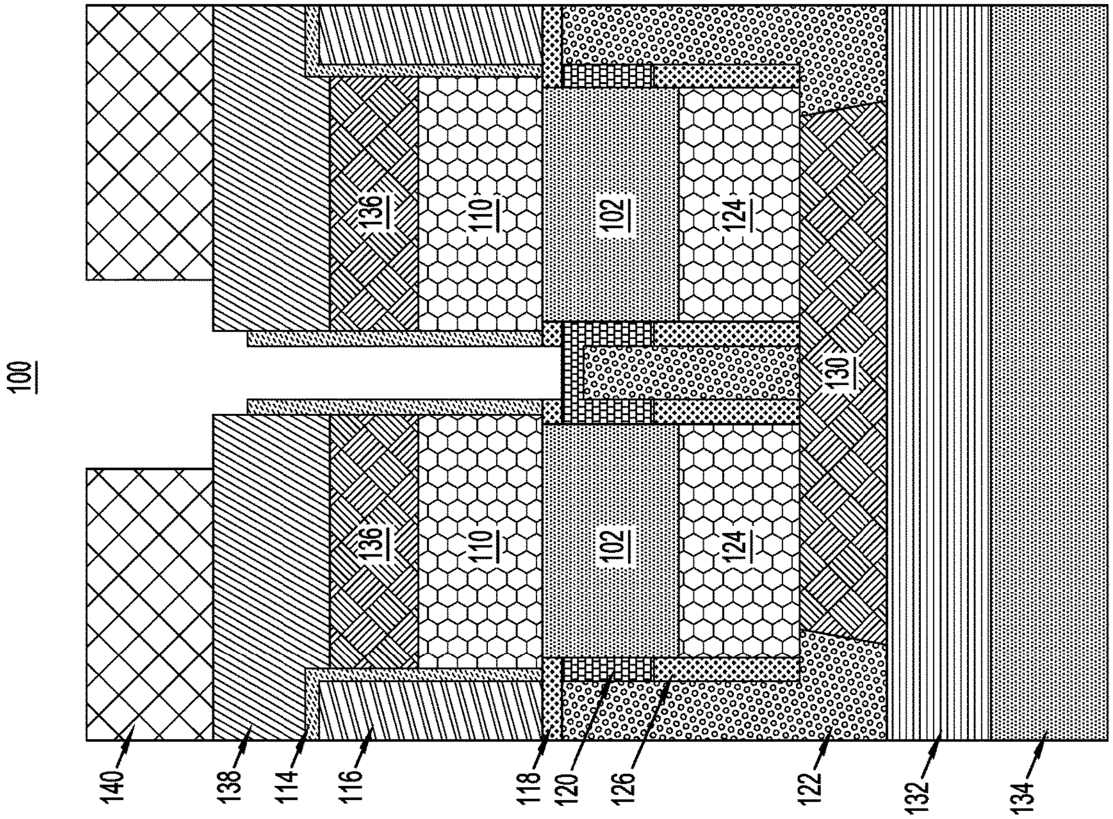
FIG. 17B is a cross-sectional view illustrating the semiconductor structure taken along the Y-Y axis of FIG. 1A at the seventeenth-intermediate fabrication stage, according to an illustrative embodiment.
Figure 17A:
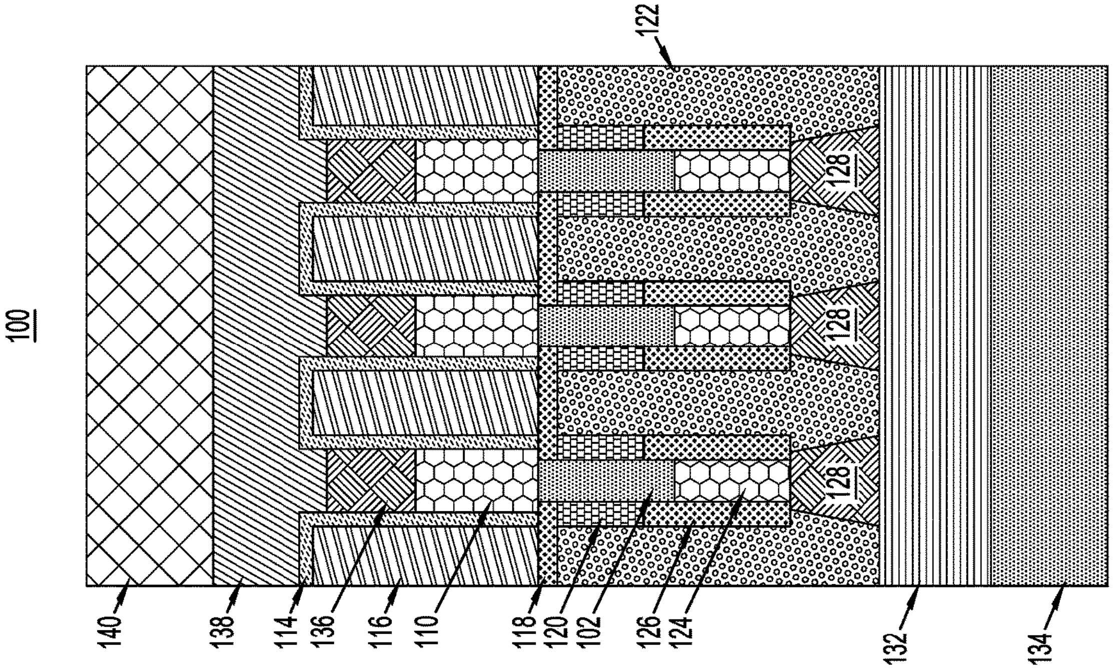
FIG. 17A is a cross-sectional view illustrating the semiconductor structure taken along the X-X axis of FIG. 1A at a seventeenth-intermediate fabrication stage, according to an illustrative embodiment.

FIGS. 17A and 17B illustrate the semiconductor structure 100 at a seventeenth-intermediate fabrication stage. During this stage, a masking layer 140 is deposited over the semiconductor structure 100 and subjected to lithographic and patterning to etch through the STI regions 116 between the PFET region and NFET region using an etching process such as RIE. In addition, a portion of the STI liner layer is removed to allow for a backside gate contact to be formed with a T-configuration as discussed below. Next, the exposed portion of the bottom spacer layer 118 is selectively removed using, for example, RIE to expose the gate structure 120 to form a backside gate contact opening. The masking layer 140 can be formed by similar processes and similar material as the masking layer 112.

Figure 18B:
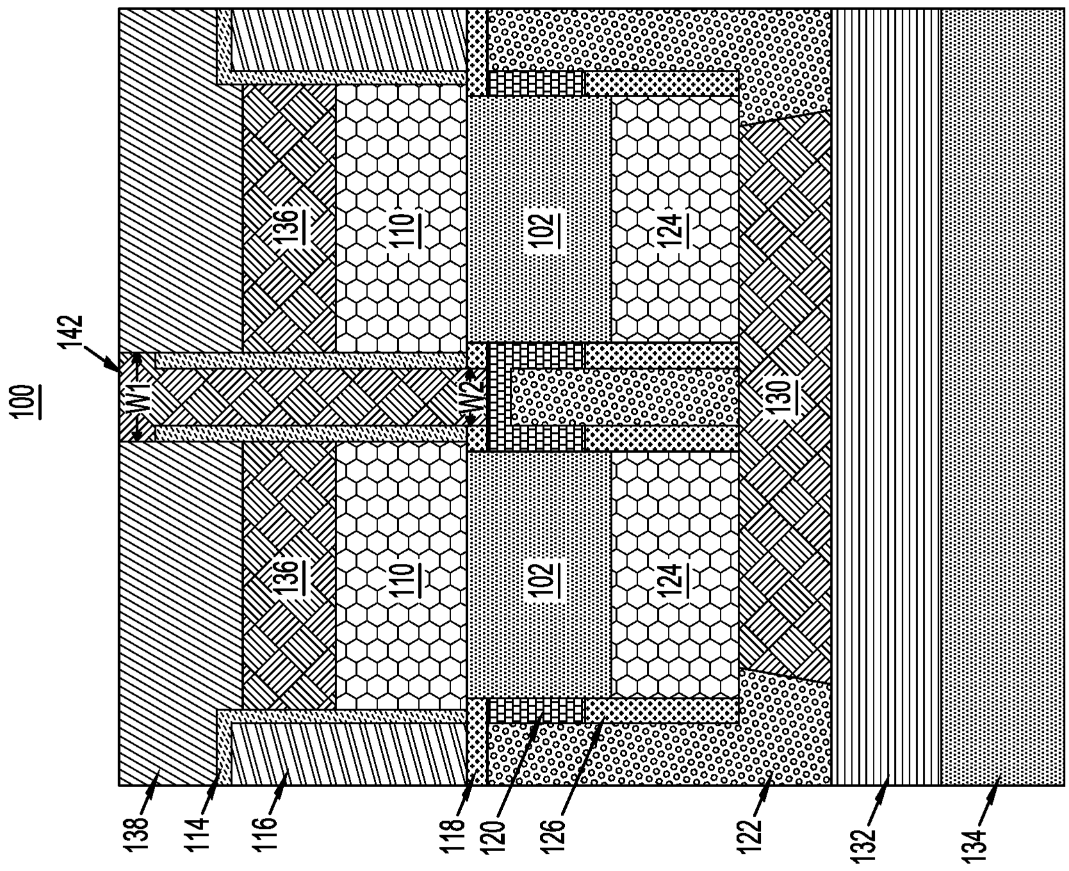
FIG. 18B is a cross-sectional view illustrating the semiconductor structure taken along the Y-Y axis of FIG. 1A at the eighteenth-intermediate fabrication stage, according to an illustrative embodiment.
Figure 18A:
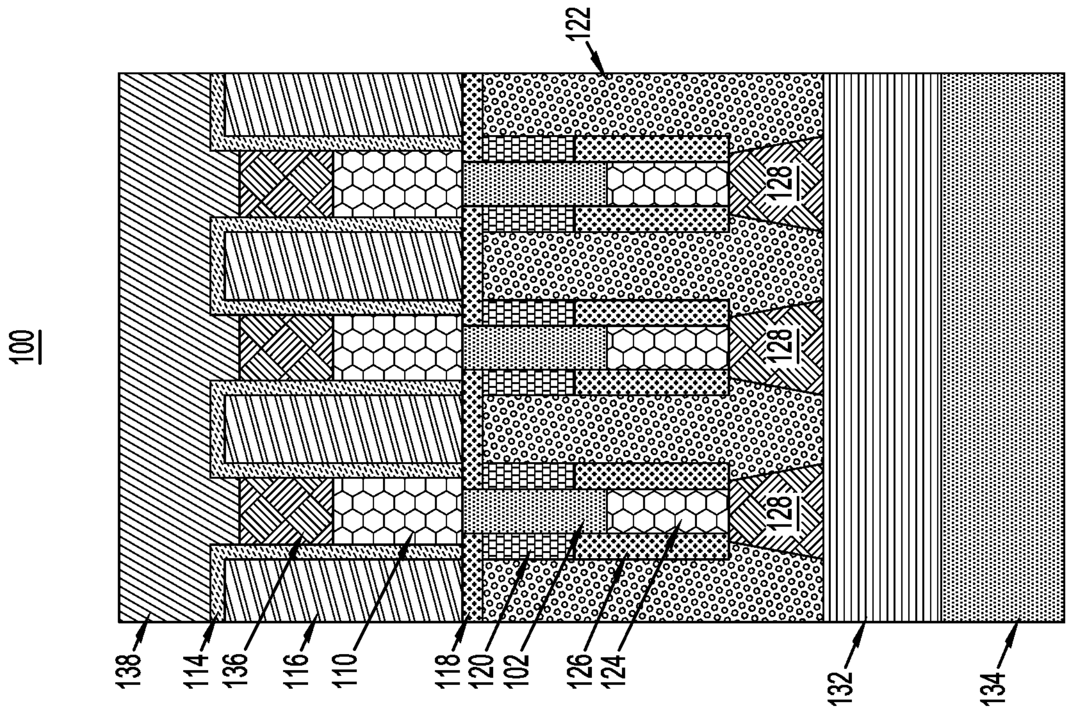
FIG. 18A is a cross-sectional view illustrating the semiconductor structure taken along the X-X axis of FIG. 1A at an eighteenth-intermediate fabrication stage, according to an illustrative embodiment.
Figure 19B:
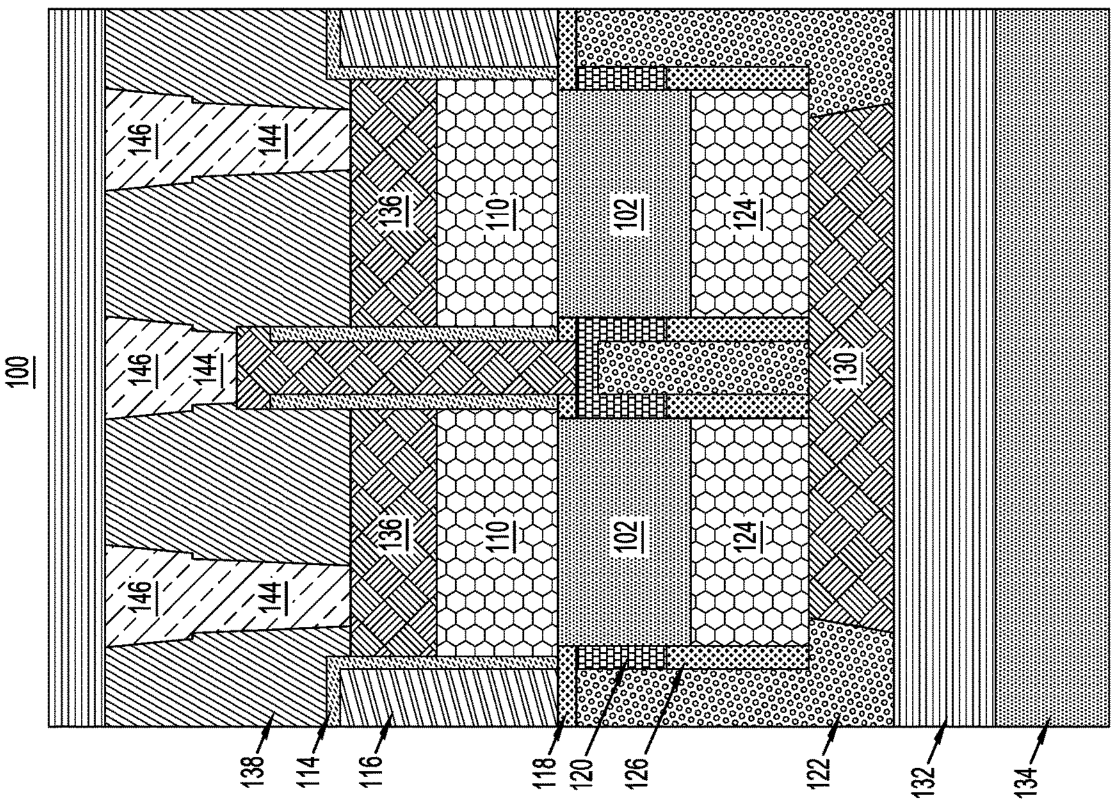
FIG. 19B is a cross-sectional view illustrating the semiconductor structure taken along the Y-Y axis of FIG. 1A at the nineteenth-intermediate fabrication stage, according to an illustrative embodiment.
Figure 19A:
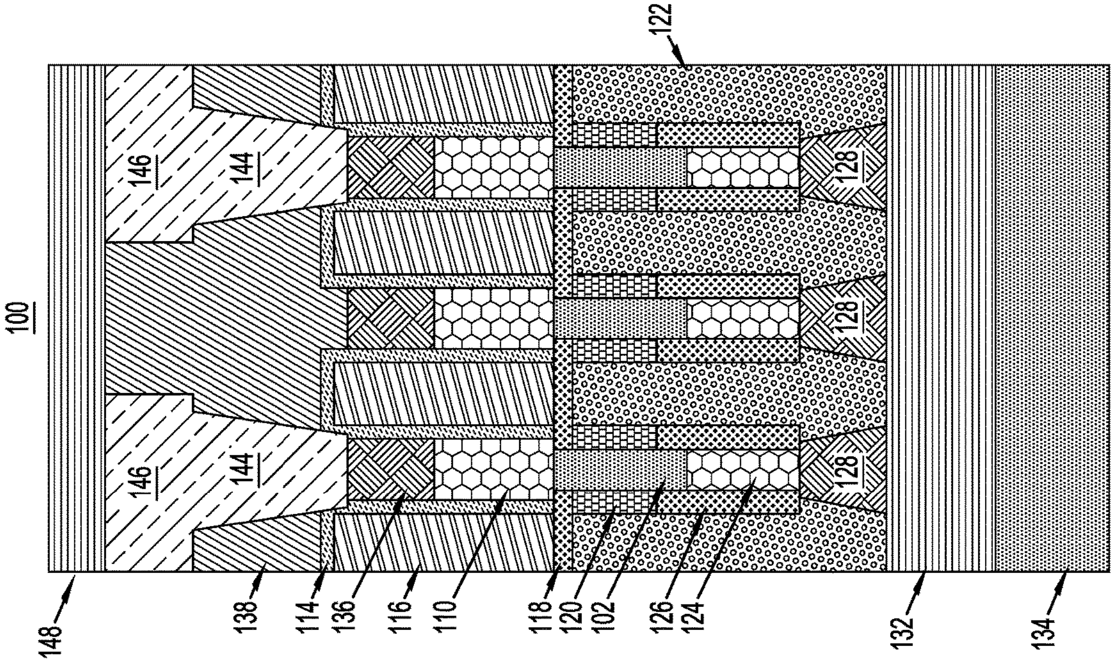
FIG. 19A is a cross-sectional view illustrating the semiconductor structure taken along the X-X axis of FIG. 1A at a nineteenth-intermediate fabrication stage, according to an illustrative embodiment.

FIGS. 18A and 18B illustrate the semiconductor structure 100 at an eighteenth-intermediate fabrication stage. During this stage, the masking layer 140 is removed using, for example, an ashing process. Next, a backside gate contact 142 is formed by deposing a conductive metal in the backside gate contact opening. The conductive metal be deposited by similar processes and be of a similar conductive metal as discussed above. The backside gate contact 142 is self-aligned with the bottom source/drain region 110 and the backside middle-of-the-line contacts 136. FIG. 18B shows the backside gate contact 142 having a top surface with a width W1 and a bottom surface having a width W2 less than the width of W1. In some embodiments, the backside gate contact 142 has a top surface with T-shaped configuration. In some embodiments, the backside gate contact 142 has a T-shaped configuration. The backside gate contact 142 extends into the backside ILD layer 138

FIGS. 19A-19D illustrate semiconductor structure 100 at a nineteenth-intermediate fabrication stage. During this stage, a backside metal via layer with backside metal vias 144 are formed by depositing an additional layer of the backside ILD layer 138. The backside ILD layer 138 is then subjected to lithographic and patterning to etch a backside via opening through the backside ILD layer 138 using an etching process such as RIE to expose the backside middle-of-the-line contacts 136. A conductive metal is deposited in the backside via opening to form the backside metal vias 144. The conductive metal be deposited by similar processes and be of a similar conductive metal as discussed above.

Next a backside metallization layer with backside metal lines 146 is formed over the backside metal via layer by depositing an additional layer of the backside ILD layer 138 over the backside metal via layer. The backside ILD layer 138 is then subjected to lithographic and patterning to etch a backside metal line opening through the backside ILD layer 138 using an etching process such as RIE to expose the backside metal vias 144 and the backside gate contact 142. A conductive metal is deposited in the backside via opening to form the backside metal lines 146. The conductive metal be deposited by similar processes and be of a similar conductive metal as discussed above.

A backside interconnect 148 is formed over the semiconductor structure 100 including the backside metal lines 146 and is based on creation of a wiring scheme that is disposed on both sides of the device layer (front end of line structure).

According to an aspect of the invention, a semiconductor structure includes:

a gate structure disposed between a first vertical field-effect transistor and a second vertical field-effect transistor, a first liner layer disposed on the gate structure and a sidewall of the first vertical field-effect transistor and the second vertical field-effect transistor, a second liner layer disposed on the gate structure and a sidewall of the second vertical field-effect transistor, a backside gate contact between opposing sidewalls of the first liner layer and the second liner layer and having a first surface disposed on the gate structure, and a backside metal via disposed on a second surface of the backside gate contact, wherein the first surface of the backside gate contact has a first width and the second surface of the backside gate contact has a second width greater than the first width.

The semiconductor structure of the illustrative embodiment advantageously uses a backside gate contact to extend a frontside gate structure into a backside interlevel dielectric layer and connecting a backside metal via to the gate structure. This, in turn, allows the semiconductor structure to be scaled down even further while alleviating the problem of an overcrowded frontside of the semiconductor device.

In some embodiments, the second surface of the backside gate contact has a T-shaped configuration.

In one or more additional illustrative embodiments, as may be combined with the preceding paragraphs, the backside gate contact extends into a backside interlevel dielectric layer.

In one or more additional illustrative embodiments, as may be combined with the preceding paragraphs, the first vertical field-effect transistor is an N-type vertical field-effect transistor and the second vertical field-effect transistor is a P-type vertical field-effect transistor.

In one or more additional illustrative embodiments, as may be combined with the preceding paragraphs, the semiconductor structure further includes a backside metal line disposed on the backside metal via, and a backside interconnect connected to the backside metal line.

In one or more additional illustrative embodiments, as may be combined with the preceding paragraphs, the semiconductor structure further includes a frontside source/drain contact disposed on a first frontside source/drain region of the first vertical field-effect transistor and on a second frontside source/drain region of the second vertical field-effect transistor.

In one or more additional illustrative embodiments, as may be combined with the preceding paragraphs, the frontside source/drain contact is connected to a frontside back-end-of-line interconnect.

According to an aspect of the invention, a semiconductor structure includes:

a first vertical field-effect transistor including a first frontside source/drain region and a first backside source/drain contact disposed on the first frontside source/drain region, a second vertical field-effect transistor adjacent the first vertical field-effect transistor and including a second frontside source/drain region and a second backside source/drain contact disposed on the second frontside source/drain region, a gate structure disposed between the first vertical field-effect transistor and the second vertical field-effect transistor, a liner layer disposed on the gate structure and opposing sidewalls of the first vertical field-effect transistor and the second vertical field-effect transistor, a backside gate contact having a first surface disposed on the gate structure and between the liner layer on the opposing sidewalls, and a backside metal via disposed on a second surface of the backside gate contact, wherein the first surface of the backside gate contact has a first width and the second surface of the backside gate contact has a second width greater than the first width.

The semiconductor structure of the illustrative embodiment advantageously uses a backside gate contact to extend a frontside gate structure into a backside interlevel dielectric layer and connecting a backside metal via to the gate structure. This, in turn, allows the semiconductor structure to be scaled down even further while alleviating the problem of an overcrowded frontside of the semiconductor device.

In some embodiments, the second surface of the backside gate contact has a T-shaped configuration.

In one or more additional illustrative embodiments, as may be combined with the preceding paragraphs, the first frontside source/drain region, the first backside source/drain contact, the second frontside source/drain region and the second backside source/drain contact are at a first level of the semiconductor structure and the gate structure is at a second level different than the first level.

In one or more additional illustrative embodiments, as may be combined with the preceding paragraphs, the backside gate contact is self-aligned to the first frontside source/drain region, the first backside source/drain contact, the second frontside source/drain region and the second backside source/drain contact.

In one or more additional illustrative embodiments, as may be combined with the preceding paragraphs, the backside gate contact extends into a backside interlevel dielectric layer.

In one or more additional illustrative embodiments, as may be combined with the preceding paragraphs, the first vertical field-effect transistor is an N-type vertical field-effect transistor and the second vertical field-effect transistor is a P-type vertical field-effect transistor.

In one or more additional illustrative embodiments, as may be combined with the preceding paragraphs, the semiconductor structure further includes a backside metal line disposed on the backside metal via, and a backside interconnect connected to the backside metal line.

In one or more additional illustrative embodiments, as may be combined with the preceding paragraphs, the semiconductor structure further includes a frontside source/drain contact disposed on a third frontside source/drain region of the first vertical field-effect transistor and on a fourth frontside source/drain region of the second vertical field-effect transistor.

In one or more additional illustrative embodiments, as may be combined with the preceding paragraphs, the frontside source/drain contact is connected to a frontside back-end-of-line interconnect.

According to an aspect of the invention, an integrated circuit includes one or more semiconductor structures, wherein at least one of the one or more semiconductor structures includes:

a gate structure disposed between a first vertical field-effect transistor and a second vertical field-effect transistor, a first liner layer disposed on the gate structure and a sidewall of the first vertical field-effect transistor and the second vertical field-effect transistor, a second liner layer disposed on the gate structure and a sidewall of the second vertical field-effect transistor, a backside gate contact between opposing sidewalls of the first liner layer and the second liner layer and having a first surface disposed on the gate structure, and a backside metal via disposed on a second surface of the backside gate contact, wherein the first surface of the backside gate contact has a first width and the second surface of the backside gate contact has a second width greater than the first width.

The integrated circuit of the illustrative embodiment advantageously uses a backside gate contact to extend a frontside gate structure into a backside interlevel dielectric layer and connecting a backside metal via to the gate structure. This, in turn, allows a semiconductor structure of the integrated circuit to be scaled down even further while alleviating the problem of an overcrowded frontside of the semiconductor device.

In one or more additional illustrative embodiments, as may be combined with the preceding paragraphs, the backside gate contact is self-aligned to a first frontside source/drain region and a first backside source/drain contact of the first vertical field-effect transistor and to a second frontside source/drain region and a second backside source/drain contact of the second vertical field-effect transistor.

In one or more additional illustrative embodiments, as may be combined with the preceding paragraphs, the first frontside source/drain region, the first backside source/drain contact, the second frontside source/drain region and the second backside source/drain contact are at a first level of the semiconductor structure and the gate structure is at a second level different than the first level.

In one or more additional illustrative embodiments, as may be combined with the preceding paragraphs, the second surface of the backside gate contact has a T-shaped configuration.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a gate structure disposed between a first vertical field-effect transistor and a second vertical field-effect transistor;

a first liner layer disposed on the gate structure and a sidewall of the first vertical field-effect transistor;

a second liner layer disposed on the gate structure and a sidewall of the second vertical field-effect transistor;

a backside gate contact between opposing sidewalls of the first liner layer and the second liner layer and having a first surface disposed on the gate structure;

a backside metal via disposed on a second surface of the backside gate contact; and a frontside source/drain contact disposed on a first frontside source/drain region of the first vertical field-effect transistor and on a second frontside source/drain region of the second vertical field-effect transistor;

wherein the first surface of the backside gate contact has a first width and the second surface of the backside gate contact has a second width greater than the first width.

2. The semiconductor structure according to claim 1, wherein the backside gate contact has a T-shaped configuration.

3. The semiconductor structure according to claim 1, wherein the backside gate contact extends into a backside interlevel dielectric layer.

4. The semiconductor structure according to claim 1, wherein the first vertical field-effect transistor is an N-type vertical field-effect transistor and the second vertical field-effect transistor is a P-type vertical field-effect transistor.

5. The semiconductor structure according to claim 1, further comprising:

a backside metal line disposed on the backside metal via; and a backside interconnect connected to the backside metal line.

6. The semiconductor structure according to claim 1, wherein the frontside source/drain contact is connected to a frontside back-end-of-line interconnect.

7. A semiconductor structure, comprising:

a first vertical field-effect transistor comprising a first backside source/drain region and a first backside source/drain contact disposed on the first backside source/drain region;

a second vertical field-effect transistor adjacent the first vertical field-effect transistor and comprising a second backside source/drain region and a second backside source/drain contact disposed on the second backside source/drain region;

a gate structure disposed between the first vertical field-effect transistor and the second vertical field-effect transistor;

a liner layer disposed on the gate structure and opposing sidewalls of the first vertical field-effect transistor and the second vertical field-effect transistor;

a backside gate contact having a first surface disposed on the gate structure and between the liner layer on the opposing sidewalls; and a backside metal via disposed on a second surface of the backside gate contact;

wherein the first surface of the backside gate contact has a first width and the second surface of the backside gate contact has a second width greater than the first width; and wherein the backside gate contact is self-aligned to the first backside source/drain region, the first backside source/drain contact, the second backside source/drain region and the second backside source/drain contact.

8. The semiconductor structure according to claim 7, wherein the backside gate contact has a T-shaped configuration.

9. The semiconductor structure according to claim 7, wherein the first backside source/drain region, the first backside source/drain contact, the second backside source/drain region and the second backside source/drain contact are at a first level of the semiconductor structure and the gate structure is at a second level different than the first level.

10. The semiconductor structure according to claim 7, wherein the backside gate contact extends into a backside interlevel dielectric layer.

11. The semiconductor structure according to claim 7, wherein the first vertical field-effect transistor is an N-type vertical field-effect transistor and the second vertical field-effect transistor is a P-type vertical field-effect transistor.

12. The semiconductor structure according to claim 7, further comprising:

a backside metal line disposed on the backside metal via; and a backside interconnect connected to the backside metal line.

13. The semiconductor structure according to claim 7, further comprising a frontside source/drain contact disposed on a third frontside source/drain region of the first vertical field-effect transistor and on a frontside source/drain region of the second vertical field-effect transistor.

14. The semiconductor structure according to claim 13, wherein the frontside source/drain contact is connected to a frontside back-end-of-line interconnect.

15. An integrated circuit comprising one or more semiconductor structures, wherein at least one of the one or more semiconductor structures comprises:

a gate structure disposed between a first vertical field-effect transistor and a second vertical field-effect transistor;

a first liner layer disposed on the gate structure and a sidewall of the first vertical field-effect transistor;

a second liner layer disposed on the gate structure and a sidewall of the second vertical field-effect transistor;

a backside gate contact between opposing sidewalls of the first liner layer and the second liner layer and having a first surface disposed on the gate structure; and a backside metal via disposed on a second surface of the backside gate contact;

wherein the first surface of the backside gate contact has a first width and the second surface of the backside gate contact has a second width greater than the first width; and wherein the backside gate contact has a T-shaped configuration.

16. The integrated circuit according to claim 15, wherein the backside gate contact is self-aligned to a first backside source/drain region and a first backside source/drain contact of the first vertical field-effect transistor and to a second backside source/drain region and a second backside source/drain contact of the second vertical field-effect transistor.

17. The integrated circuit according to claim 16, wherein the first backside source/drain region, the first backside source/drain contact, the second backside source/drain region and the second backside source/drain contact are at a first level of the at least one of the one or more semiconductor structures and the gate structure is at a second level different than the first level.

18. The integrated circuit according to claim 15, wherein the backside gate contact extends into a backside interlevel dielectric layer.

19. The integrated circuit according to claim 15, wherein the first vertical field-effect transistor is an N-type vertical field-effect transistor and the second vertical field-effect transistor is a P-type vertical field-effect transistor.

20. The integrated circuit according to claim 15, wherein the at least one of the one or more semiconductor structures further comprises:

a backside metal line disposed on the backside metal via; and a backside interconnect connected to the backside metal line.

* * * * *